United States Patent
Warzyszynski

(10) Patent No.: US 9,153,422 B2
(45) Date of Patent: Oct. 6, 2015

(54) ARC PVD PLASMA SOURCE AND METHOD OF DEPOSITION OF NANOIMPLANTED COATINGS

(75) Inventors: Mariusz Warzyszynski, Mississauga, CA (US); Jonathan Webster, legal representative, Mississauga, CA (US)

(73) Assignee: EnvAeroSpace, Inc., Brampton, Ontario (CA)

( * ) Notice: Subject to any disclaimer, the term of this patent is extended or adjusted under 35 U.S.C. 154(b) by 159 days.

(21) Appl. No.: 13/564,031

(22) Filed: Aug. 1, 2012

(65) Prior Publication Data
US 2013/0032469 A1   Feb. 7, 2013

Related U.S. Application Data

(60) Provisional application No. 61/514,445, filed on Aug. 2, 2011.

(51) Int. Cl.
| | |
|---|---|
| H01J 37/32 | (2006.01) |
| H01J 37/34 | (2006.01) |
| C23C 14/35 | (2006.01) |
| C23C 14/32 | (2006.01) |

(52) U.S. Cl.
CPC ....... *H01J 37/3458* (2013.01); *H01J 37/32055* (2013.01); *H01J 37/34* (2013.01); *H01J 37/345* (2013.01); *H01J 37/3452* (2013.01); *C23C 14/325* (2013.01); *C23C 14/35* (2013.01); *H01J 37/32614* (2013.01); *H01J 37/3408* (2013.01); *H01J 37/3455* (2013.01)

(58) Field of Classification Search
CPC ... H01J 37/34; H01J 37/3423; H01J 37/3429; H01J 37/3458; H01J 37/345; H01J 37/3452; H01J 37/3455; H01J 37/32055; C23C 14/35; C23C 14/325

See application file for complete search history.

(56) References Cited

U.S. PATENT DOCUMENTS

| | | | |
|---|---|---|---|
| 3,625,848 A | 12/1971 | Snaper | |
| 3,783,231 A | 1/1974 | Sablev | |
| 3,793,179 A | 2/1974 | Sablev | |
| 3,836,451 A * | 9/1974 | Snaper | 204/298.41 |
| 3,900,592 A | 8/1975 | Kennedy | |
| 4,452,686 A | 6/1984 | Axenov | |
| 4,492,845 A | 1/1985 | Kljuchko | |
| 4,512,867 A | 4/1985 | Andreev | |
| 4,551,221 A | 11/1985 | Axenov | |

(Continued)

FOREIGN PATENT DOCUMENTS

JP       2000313957 A  * 11/2000

OTHER PUBLICATIONS

Machine Translation JP 2000313957 A.*

*Primary Examiner* — Michael Band
(74) *Attorney, Agent, or Firm* — EnvAeroSpace, Inc.

(57) ABSTRACT

The invention relates to a method and an apparatus for applying metallic, ceramic or composite thin film coatings onto parts, components and tools (e.g. gas turbine engine compressor blades or cutting tools) by a cathodic arc deposition technique. The method and the apparatus allows for a continually changing structure of the applied film by nanoimplanting atoms, molecules, compounds or other chemical species and structures of different materials thus coating a substrate during a single process. Furthermore, during the same process it allows for creating a coating with specific parameters as required. For instance: hardness, smoothness, corrosion resistance, erosion resistance.

5 Claims, 27 Drawing Sheets

(56) References Cited

U.S. PATENT DOCUMENTS

| | | |
|---|---|---|
| 4,563,262 A | 1/1986 | Sablev |
| 4,622,452 A | 11/1986 | Bergman |
| 4,673,477 A | 6/1987 | Ramalingam |
| 4,839,245 A | 6/1989 | Sue |
| 5,185,211 A | 2/1993 | Sue |
| 5,203,980 A | 4/1993 | Cremer |
| 5,242,753 A | 9/1993 | Sue |
| 5,269,896 A | 12/1993 | Munemasa |
| 5,298,136 A | 3/1994 | Ramalingam |
| 5,317,235 A | 5/1994 | Treglio |
| 5,380,421 A | 1/1995 | Gorokhovsky |
| 5,458,754 A | 10/1995 | Sathrum |
| 5,861,088 A | 1/1999 | Curtins |
| 5,895,559 A | 4/1999 | Christy |
| 5,972,185 A | 10/1999 | Hendricks |
| 6,009,829 A | 1/2000 | Ramalingam |
| 6,103,074 A | 8/2000 | Khominich |
| 6,334,405 B1 | 1/2002 | Takahara |
| 6,350,356 B1 * | 2/2002 | Welty ................ 204/298.12 |
| 6,645,354 B1 | 11/2003 | Gorokhovsky |
| 6,692,623 B2 | 2/2004 | Miyake |
| 6,797,335 B1 | 9/2004 | Paderov |
| 6,869,509 B2 | 3/2005 | Gstoehl |
| 6,929,727 B2 | 8/2005 | Gorokhovsky |
| 6,936,145 B2 | 8/2005 | Sunthankar |
| 7,186,092 B2 | 3/2007 | Bruce |
| 7,211,338 B2 | 5/2007 | Strangman |
| 7,229,675 B1 | 6/2007 | Paderov |
| 7,744,986 B2 | 6/2010 | Rice |
| 7,828,946 B2 | 11/2010 | Larrinaga |
| 2005/0103620 A1 * | 5/2005 | Chistyakov ........... 204/192.12 |
| 2006/0137969 A1 * | 6/2006 | Feldewerth et al. ..... 204/192.15 |

* cited by examiner

ARC PVD PLASMA SOURCE AND METHOD OF DEPOSITION OF NANOIMPLANTED COATINGS

CROSS-REFERENCE TO RELATED APPLICATIONS

Provisional Patent Application No. 61/514,445, filed on Aug. 2, 2011.

BACKGROUND OF THE INVENTION

The present invention relates to an arc source for a cathodic arc physical vapor deposition system. The cathodic arc vacuum evaporation technique is used to deposit metallic, ceramic and composite coatings on the following; cutting tools, punching and forming tools and injection molding tools. It is further applied in optical and decorative applications, medical tools and implants, automotive and aerospace industries. It's becoming widely used in aircraft, generators and tank gas turbines.

Each of these applications requires different coating properties. Parameters like: yield strength, toughness, hardness, adhesion, surface roughness, wear resistance, corrosion resistance and erosion resistance have to be specifically chosen, the coating is then designed based on those requirements.

For example helicopter turbine engine compressor blades used in harsh desert conditions require erosion resistance. Gas turbine engines ingest sand and dust which erode the leading edges of the airfoils. Large particles roll over the blades' frontal surface. Engine power begins to deteriorate rapidly leading to early blade replacement and decreased fuel economy. Engine operating life is reduced.

Modern surface engineering requires nanotechnology adjustments to create the state of the art thin films. Instruments of surface engineering have to be more and more sophisticated to generate nanostructure, nanocomposite, single or multi layers and super lattices.

There is a couple existing patents which provide methods of modifying physical vapor deposition coating.
U.S. Pat. No. 3,900,592 presents a method for coating where the composition of the deposit is changed by introducing a gas during the deposition to produce a hardness gradient in the deposit.
U.S. Pat. No. 4,839,245 describes zirconium nitride coating for turbine blades to provide erosion resistance.
U.S. Pat. No. 5,185,211 presents nonstoichiometric titanium nitride coating.
U.S. Pat. No. 5,242,753 discloses substoichiometric zirconium nitride coating.
U.S. Pat. No. 6,797,335 provides method of deposition of erosion and corrosion resistant coatings on machine components.
U.S. Pat. No. 7,186,092 presents a coated turbine airfoil having an improved impact and erosion resistance.
U.S. Pat. No. 7,211,338 provides hard, ductile coating system.
U.S. Pat. No. 7,229,675 discloses a method of forming a multilayer coating by combining and simultaneously or consecutively using of various technologies.
U.S. Pat. No. 7,744,986 presents multilayered resistant coating for gas turbines.

These methods are using several known arc evaporation sources.
U.S. Pat. No. 3,625,848 describes a beam gun for use in creating an arc discharge between an anode and a cathode.
U.S. Pat. No. 4,492,845 provides an arc evaporation apparatus having an annular cathode.
U.S. Pat. No. 4,563,262 provides a cathode with unitary design, consisting of a plurality of layers of different metals.
U.S. Pat. No. 4,622,452 presents an electrode apparatus with a coolant cavity for actively and efficiently cooling substantially the entire lower surface of the electrode.
U.S. Pat. No. 5,203,980 provides a large surface cathode arrangement with a consumable cathode plate that is connected via an intermediate plate with high electrical and thermal conductivity to a base plate.
U.S. Pat. No. 5,317,235 discloses a cathodic arc metal deposition apparatus that prevents the deposition of metal droplets with the metal ions being deposited.

Many methods of efficient utilization were provided.
U.S. Pat. No. 3,783,231 shows a cathode using a magnetic field for retaining the cathode spot on the surface of the cathode.
U.S. Pat. No. 3,793,179 presents an apparatus which is maintaining the cathode spot using a shield.
U.S. Pat. No. 4,452,686 provides a cathode, a cylindrical anode and a focusing solenoid arranged coaxially with the cathode.
U.S. Pat. No. 4,512,867 discloses an apparatus which performs more efficient utilization of the electrode using a magnetic field to spread plasma over the evaporative surface.
U.S. Pat. No. 4,551,221 describes an apparatus having a solenoid coaxially disposed relative to the consumable cathode and having a tubular anode.
U.S. Pat. No. 4,673,477 discloses an apparatus in which the track of the arc is controlled with a magnetic field established with the permanent magnet that is moved in a closed path relative to the cathode.
U.S. Pat. No. 5,269,896 discloses a cathodic arc in which random motion of an arc spot is extinguished by a shield surrounding a circumferential side of the cathode with a gap.
U.S. Pat. No. 5,298,136 describes an apparatus which is controlling and steering the arc in a desired path as necessary to produce coatings of the desired compositions using magnetic fields generated to provide arc path control and modulation for efficient cathode utilization.
U.S. Pat. No. 5,380,421 presents an apparatus for the production of coatings, including a rectangular cathode plate, primary and auxiliary anodes and static and dynamic magnetic stabilizing subsystems.
U.S. Pat. No. 5,458,754 provides a plasma enhancement apparatus includes a magnet disposed about a magnet axis and defining an aperture for plasma.
U.S. Pat. No. 5,861,088 discloses a magnetic field cathode for arc discharge vaporizers.
U.S. Pat. No. 5,895,559 presents a cathodic arc which is maintaining the cathode spot using an insulating ring.
U.S. Pat. No. 5,972,185 shows a cathodic arc which produces a magnetic field for steering the arc around an evaporative surface.
U.S. Pat. No. 6,009,829 provides an apparatus for driving the arc around an axially extending evaporative surface of the cathode.
U.S. Pat. No. 6,103,074 discloses an apparatus which is creating a magnetic field of a distinctive cusp shape to trap and focus plasma particles.
U.S. Pat. No. 6,334,405 presents an evaporation source with a magnetic field generating source which can reduce the number of molten particles arriving at a substrate and deviation of occurrence of arc spots can be suppressed.

U.S. Pat. Nos. 6,645,354 and 6,929,727 provide an arc coating apparatus having a steering magnetic field source comprising steering conductors.

U.S. Pat. No. 6,692,623 discloses an arc deposition apparatus includes a plurality of magnetic coils for guiding plasma.

U.S. Pat. No. 6,869,509 presents an arc source which comprises an insulated counter-electrode and/or an AC magnet system.

U.S. Pat. No. 6,936,145 describes a cathodic arc with external current switching contacts to improve coating uniformity.

U.S. Pat. No. 7,828,946 discloses a magnetic guide that controls an electric arc between an anode and a cathode.

What is needed is an apparatus which can combine all known surface engineering techniques in the cathodic arc physical vapor deposition technology and generate high quality coatings with a relatively simple and economical method of production.

BRIEF SUMMARY OF THE INVENTION

It is the objective of this invention to provide a method and an apparatus which allows for continually changing the structure of the applied film by nanoimplanting atoms, molecules, compounds or other chemical species and structures of different materials thus coating a substrate during one cathodic arc physical vapor deposition process, all while creating a coating with the required parameters.

The present invention offers a device and a method that would be simpler in design and operation than its predecessors. It allows for more possible options and combinations of surface engineering.

The apparatus implements a cathode with special sections of diverse materials to provide the required multiple selections.

The disclosed solution presents special zones of a constant magnetic field, created by magnetic coils or magnets, which maintain a cathode spot in the required section of the cathode containing the material of choice.

The specified method, as a result of various combinations of materials allows for controlling the hardness gradient, which is increased or decreased as required.

This method as a result of multiple material selections allows for managing stoichiometry. This has great influence on the hardness of the coating.

The present method as a result of available combinations of materials allows for creating multi nanocomposites.

The method allows for creating multi material nanostructures. The apparatus is able to build multi layers and super lattices with unusual combinations and choices of options.

BRIEF DESCRIPTION OF THE SEVERAL VIEWS OF THE DRAWINGS

The present invention will be thoroughly described by referencing the accompanying drawings, wherein.

DETAILED DESCRIPTION OF THE INVENTION

The present invention employs an apparatus which within one process provides a continuously changing structure of the applied film.

Figure 1:
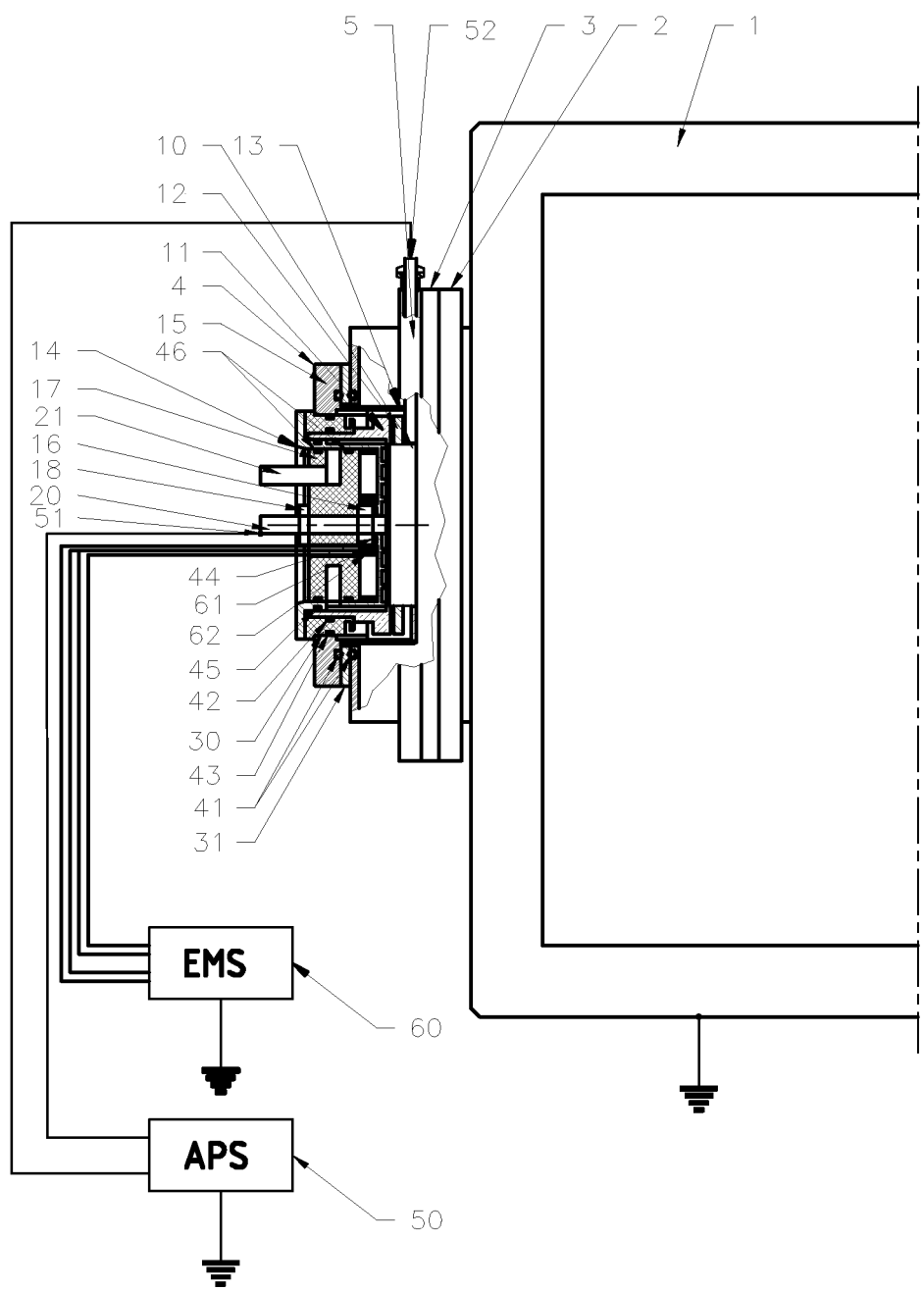
FIG. 1 is a sectional view of an apparatus for a cathodic arc deposition, made according to the present invention with particular reference to the arc source with an electronic material sequencer.

FIG. 1 presents a cathodic arc physical vapor deposition system which contains: a vacuum processing chamber 1, an arc source 4 with an Arc Power Supply (APS) 50, a chamber evacuation system, a gas supply system, a substrate holding device, a bias voltage supply and a process control system. The arc source 4 is assembled to an anode 5, insulated from the anode 5 by an insulator 31 and sealed from vacuum by o-rings 41. The anode 5 is fixed to a chamber flange 2. The anode 5 is insulated from the chamber 1 by an insulator 3. The arc source 4 contains a flange 15 which through an insulator 30 is supporting a cathode holder 11. A cathode 10 is held by the cathode holder 11 and locked by a holding ring 12. The cathode holder 11 is isolated from the vacuum by o-rings 42 and 43. The cathode 10 is shielded by a cover 13. The cathode holder 11 and the cathode 10 are water cooled. The cooling is provided by a water distribution insert, 14 which is fixed by a nut 16 and sealed from a water leak by o-rings 44, 45 and 46. Water is delivered through a water input connector 20 distributed by a water collector 17 and drained by a water connector 21. The water collector 17 is fixed by a nut 18. Internal constant magnetic field coils 61 and 62, controlled by an electronic material sequencer 60 are placed directly behind the cathode 10. The arc power supply 50 is connected to the arc source 4 through a connector 51 and to an arc starter 52.

During the process, when the vacuum system establishes the selected parameters of the process the arc source 4 is then powered by the arc power supply 50 and started by the arc starter 52. At the same time one of the internal constant magnetic field coils 61 or 62 is selected and powered by the electronic material sequencer 60. The magnetic field created by the coil is maintaining the cathode spot within the borders of required zone. The borders of the internal constant magnetic field correspond to the borders of section of selected material. Magnetic lines of force are normal (perpendicular) to the surface of the cathode 10. During the process the electronic material sequencer 60 is changing the material as per programmed sequence.

Figure 2:
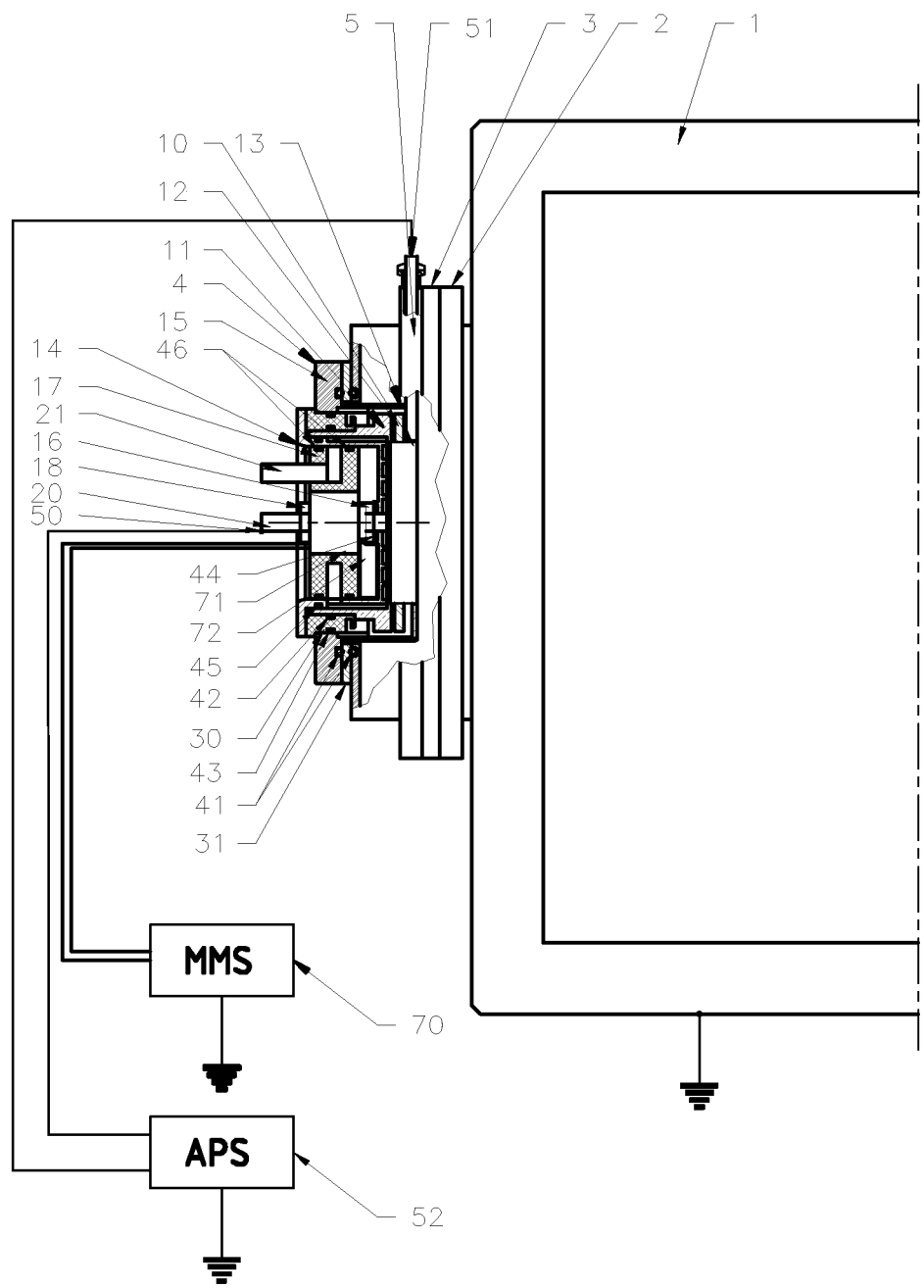
FIG. 2 is a sectional view of an apparatus for a cathodic arc deposition, made according to the present invention with particular reference to the arc source with a mechanical material sequencer.

FIG. 2 shows a cathodic arc physical vapor deposition system in the same configuration as in FIG. 1 with one exception; internal constant magnetic field coils 61 and 62 are replaced by a magnet 72. The magnet 72 is controlled by a step motor 71 and a mechanical material sequencer 70.

During the process, when the vacuum system establishes the selected parameters of the process the arc source 4 is powered by the arc power supply 50 and started by the arc starter 52. At the same time the magnet 72 is motorized by the mechanical material sequencer 70 and is set in the required position. The magnetic field created by the magnet is maintaining the cathode spot inside the borders of the required zone. Magnetic lines of force are normal (perpendicular) to the surface of the cathode 10. The borders of the internal constant magnetic field zone correspond to the borders of the section of selected material. During the process the mechanical material sequencer 70 is changing material as per programmed sequence.

Different shapes of the cathode with diverse material sections, and varying magnetic coils and magnets are shown in the next drawings.

Figure 3:
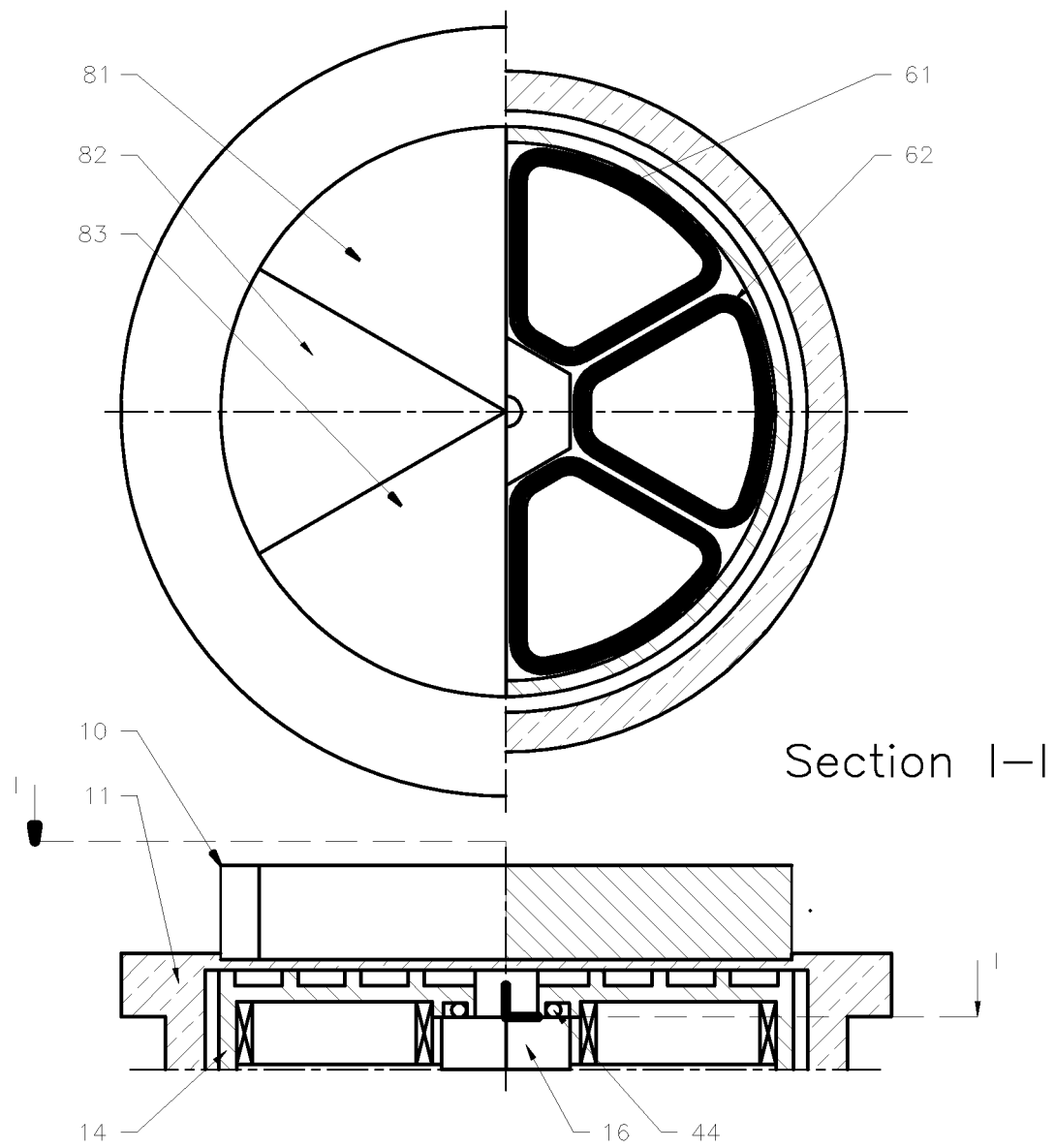
FIG. 3 is a sectional view of the arc source with a round cathode including six material sections and six sextant shaped magnetic coils powered by an electronic material sequencer.

The arc source 4 with a round cathode 10 including six sections of materials 81, 82, 83 etc. is introduced in FIG. 3. There are six sextant shaped magnetic coils 61, 62 etc. assembled in the insert 14. The sextant shaped magnetic coil corresponds to the specific section of the cathode containing a particular material.

Figure 4:
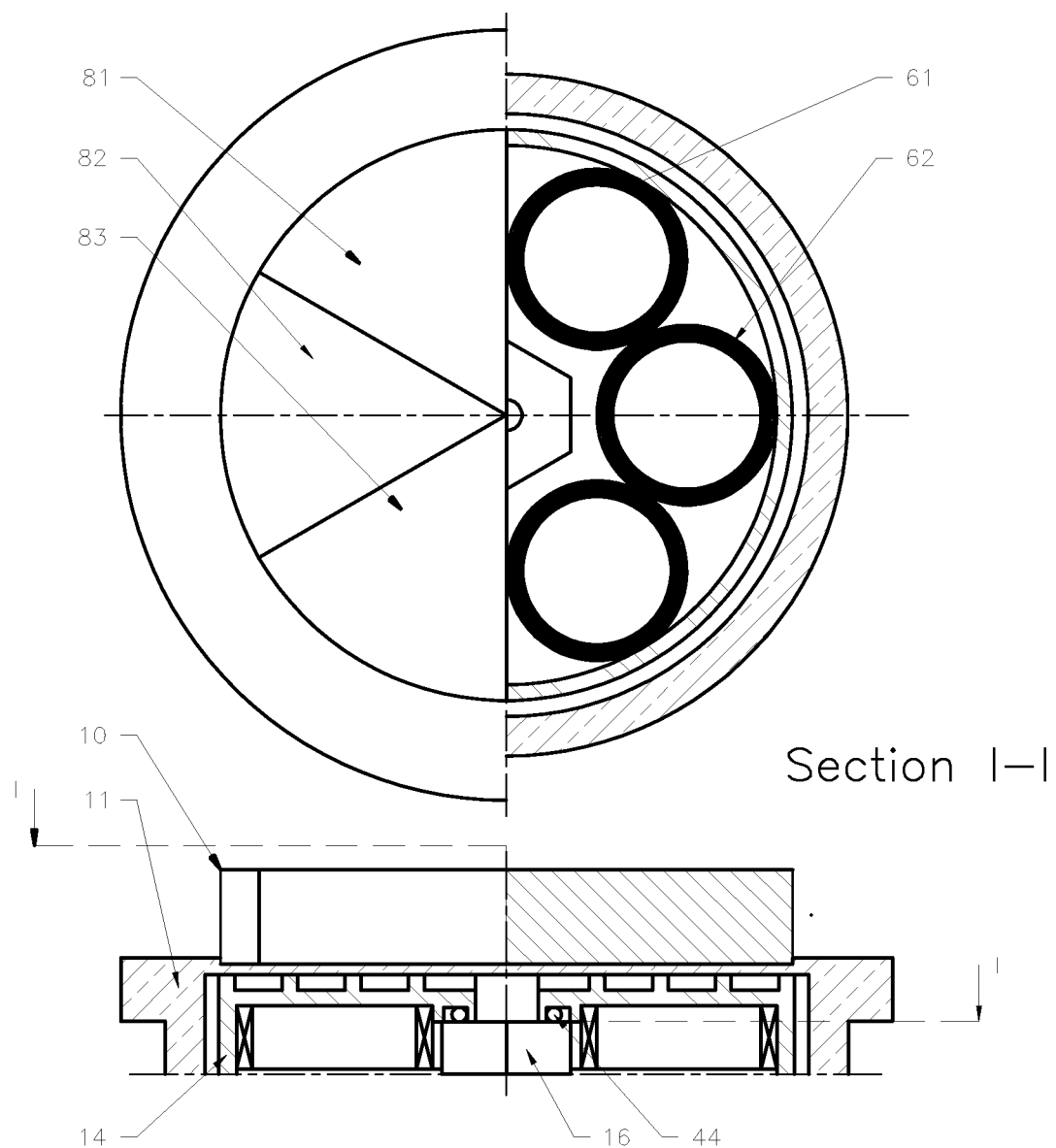
FIG. 4 is a sectional view of the arc source with a round cathode including six material sections and six circle shaped magnetic coils powered by an electronic material sequencer.

FIG. 4 is another option of the same solution. Six circle shaped magnetic coils 61, 62 etc. are used instead of sextant shaped magnetic coils. This option does not provide complete and equal utilization of the materials (81, 82, 83 etc) as opposed to the previous option.

Figure 5:
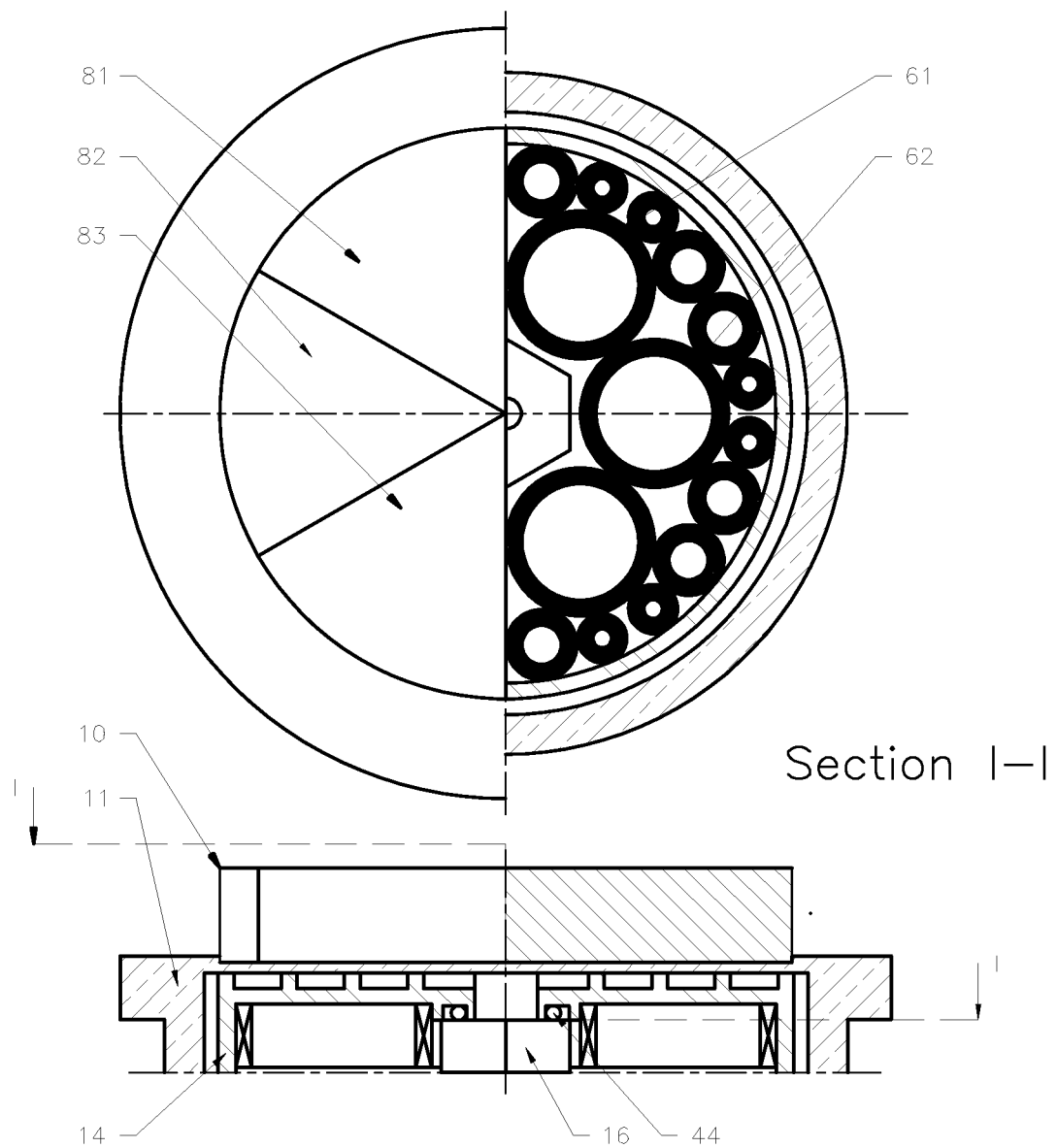
FIG. 5 is a sectional view of the arc source with a round cathode including six material sections and multiple circle shaped magnetic coils of varying size powered by an electronic material sequencer.

An alternative with better utilization is presented in FIG. 5. Multiple circle shaped magnetic coils 61, 62 etc. of varying size fill the sextant shaped zones which correspond to the specific section of the cathode containing one of the particular materials 81, 82, 83 etc. All the magnetic coils of varying size should have an equal magnetic field.

Figure 6:
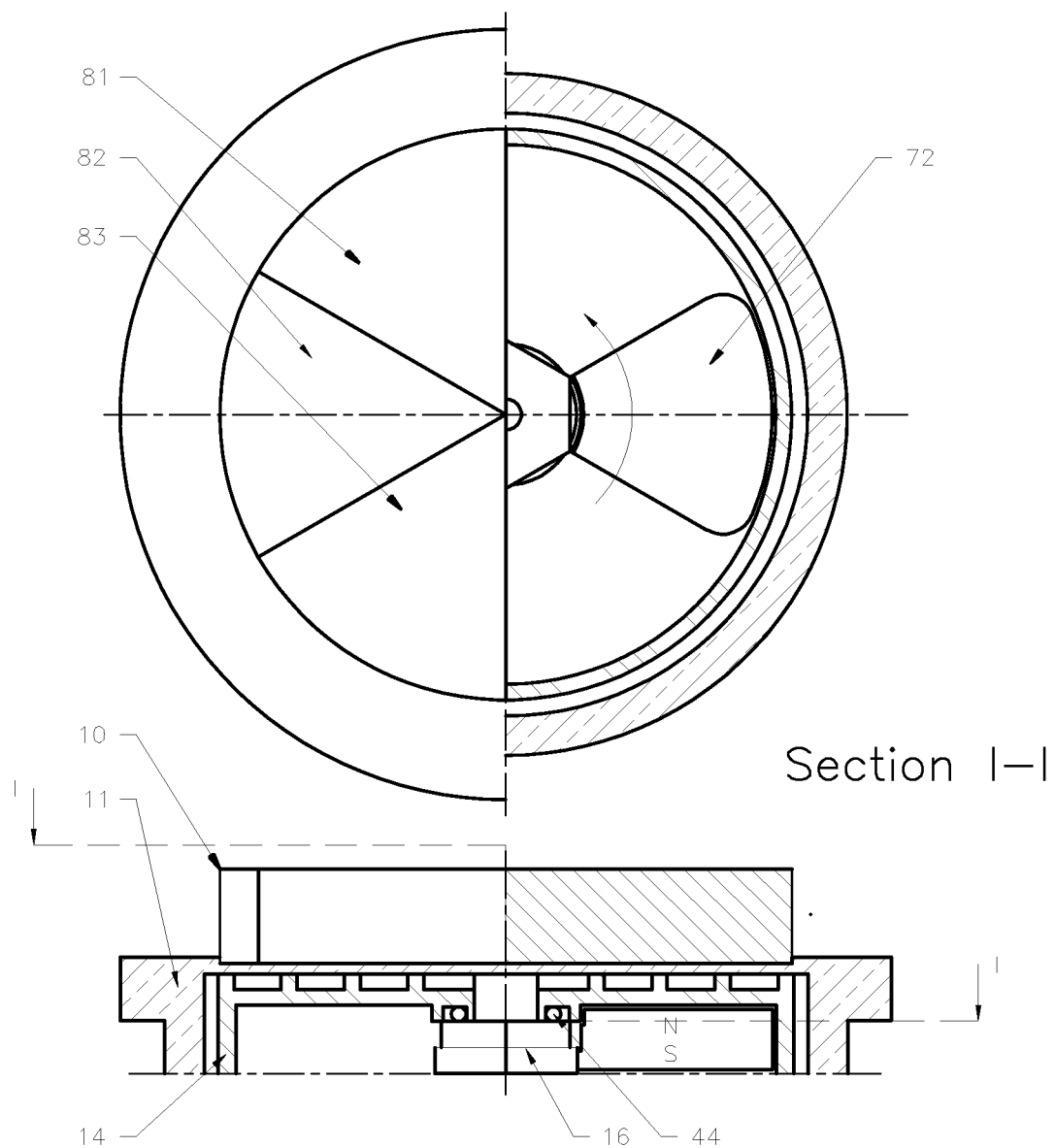
FIG. 6 is a sectional view of the arc source with a round cathode including six material sections and a sextant shaped magnet motorized by a mechanical material sequencer.

FIG. 6 implements a version with a sextant shaped magnet 72 for the arc source with a round cathode including six material sections 81, 82, 83 etc.

Figure 7:
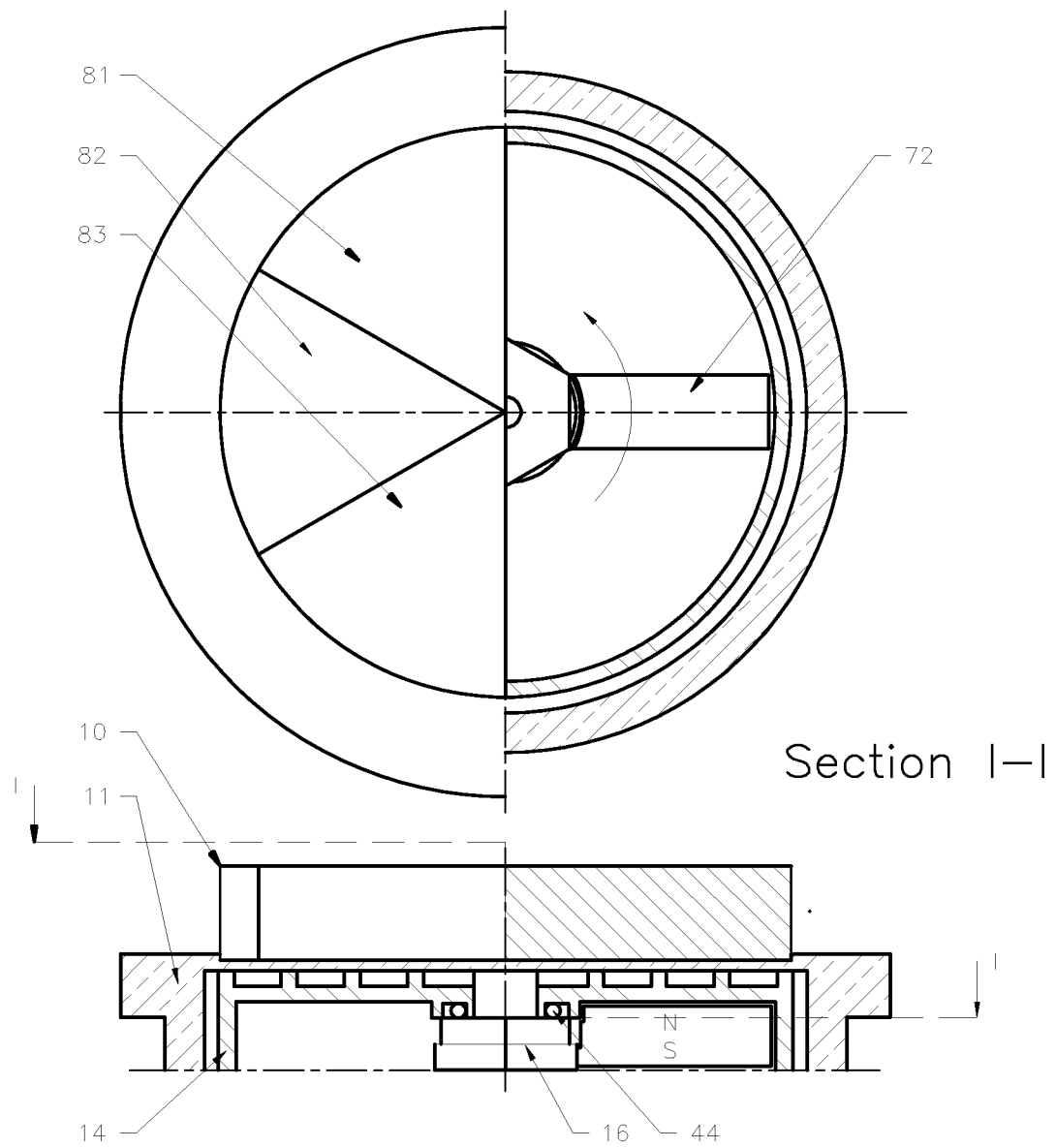
FIG. 7 is a sectional view of the arc source with a round cathode including six material sections and a rectangle shaped magnet motorized by a mechanical material sequencer.

The sextant shaped magnet can be replaced by a rectangle shaped magnet 72 like in FIG. 7. In this option complete and equal utilization of materials 81, 82, 83 is an issue.

Figure 8:
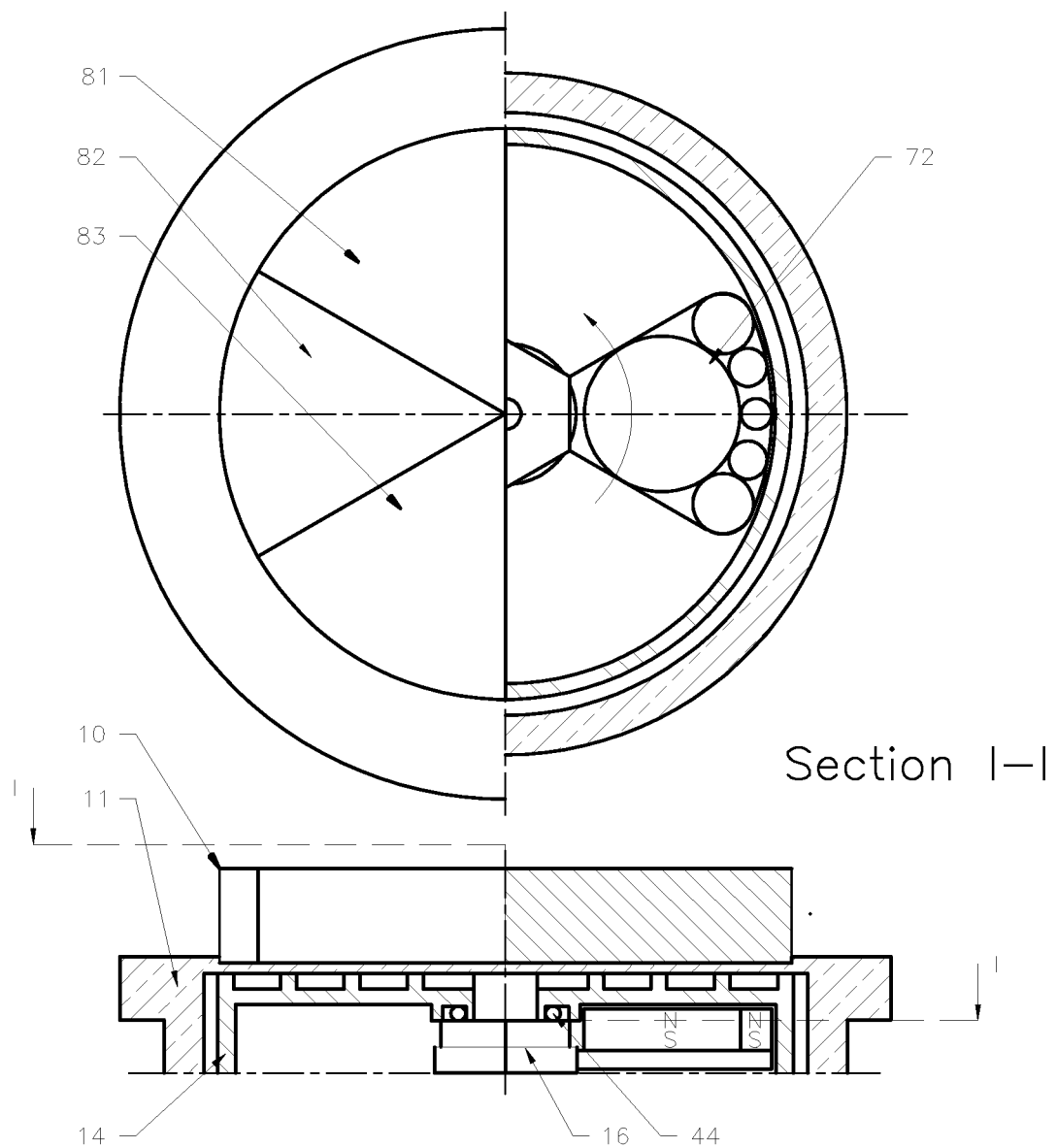
FIG. 8 is a sectional view of the arc source with a round cathode including six material sections and multiple circle shaped magnets of varying size motorized by a mechanical material sequencer.

A better alternative for earlier adaptation is FIG. 8 with multiple circle shaped magnets 72 of varying size. The magnets fill the sextant shaped zone corresponding to the specific section of the cathode containing one of the particular materials 81, 82, 83 etc. All the magnets of varying size should have an equal magnetic field.

Figure 9:
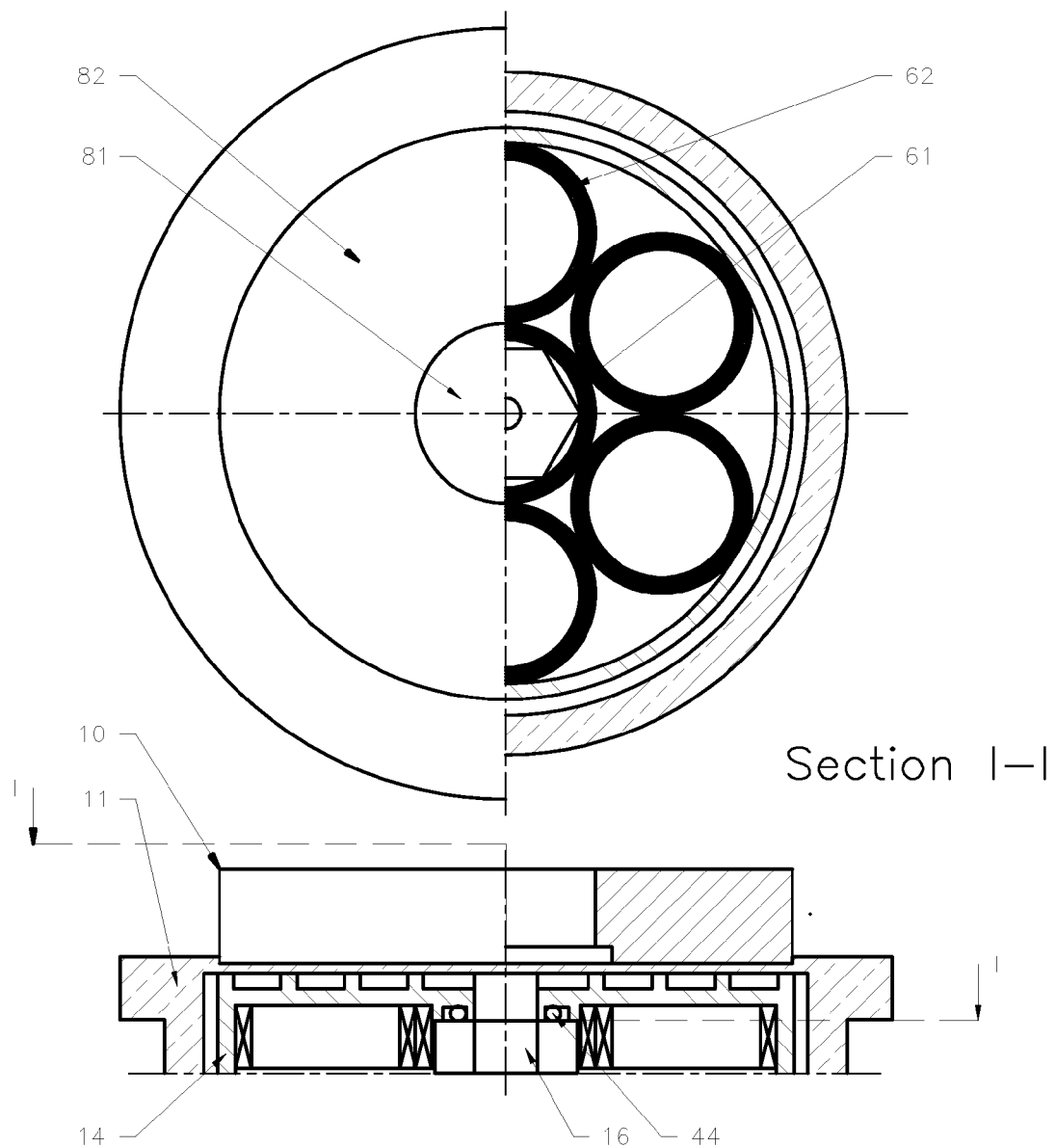
FIG. 9 is a sectional view of the arc source with a round cathode including two sections of concentric circle shaped materials and multiple circle shaped magnetic coils powered by an electronic material sequencer.

FIG. 9 presents the arc source 4 with a round cathode including two sections of concentric circle shaped materials 81, 82 and multiple circle shaped magnetic coils 61, 62. The two concentric circles compose an inner circle 81 and an outer ring 82.

Figure 10:
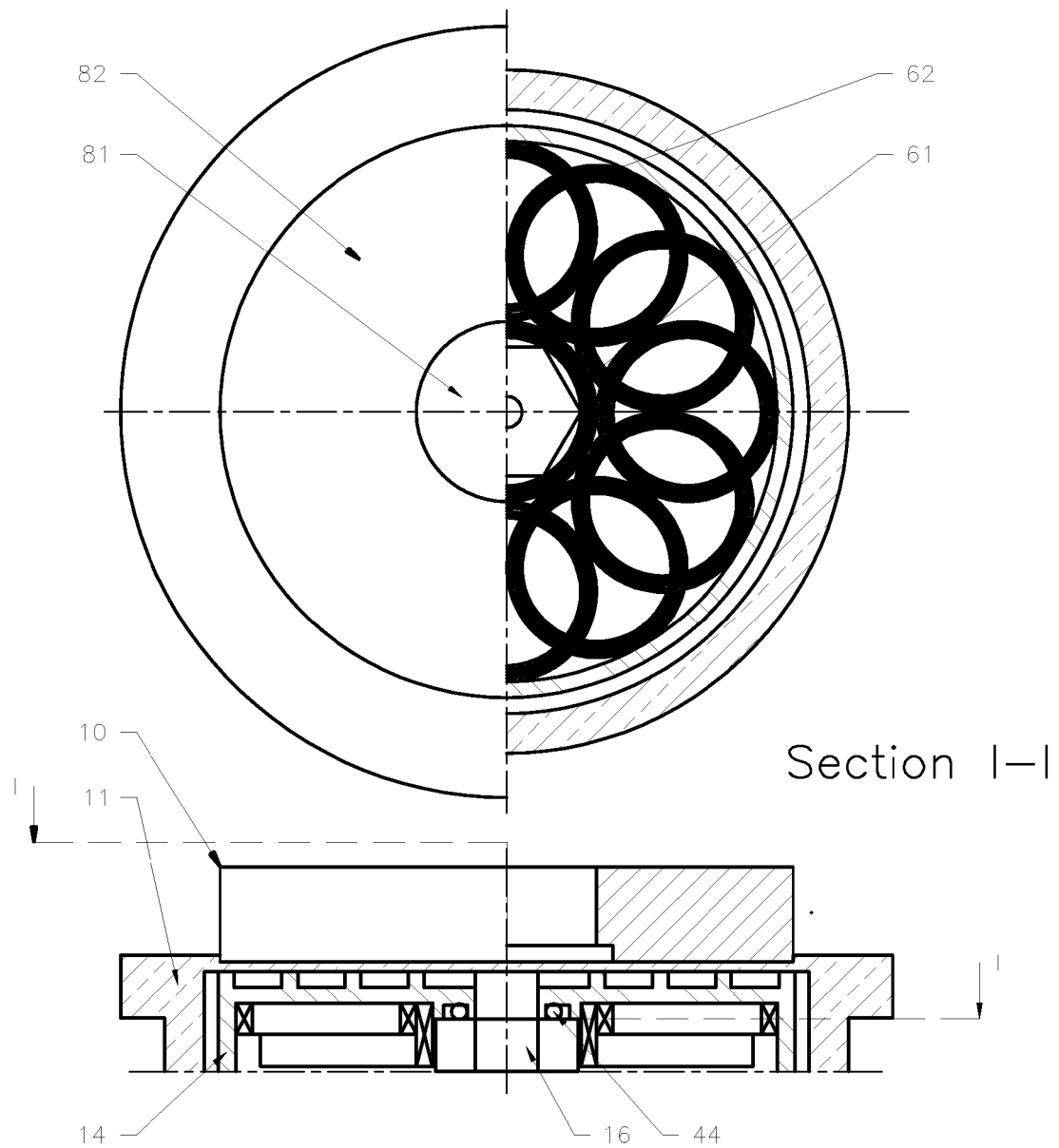
FIG. 10 is a sectional view of the arc source with a round cathode including two sections of concentric circle shaped materials and multiple circle shaped magnetic coils in two levels powered by an electronic material sequencer.

An option with two sections of concentric circle shaped materials 81, 82 and multiple circle shaped magnetic coils 61, 62 distributed on two levels is shown in FIG. 10. This solution provides complete and equal utilization of the material.

Figure 11:
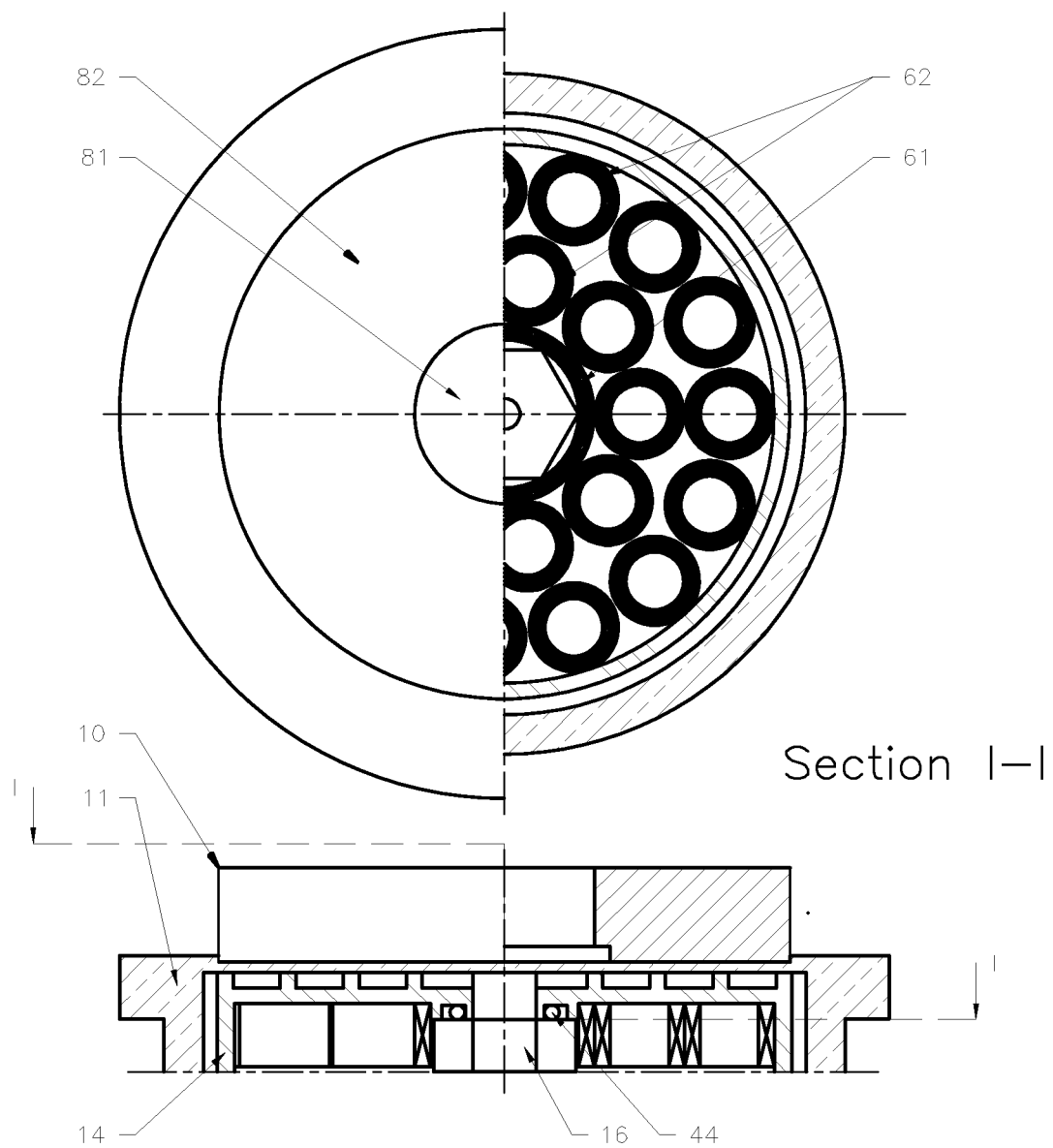
FIG. 11 is a sectional view of the arc source with a round cathode including two sections of concentric circle shaped materials and multiple circle shaped magnetic coils powered by an electronic material sequencer.

A version providing a similar advantage is presented in FIG. 11 with two sections of concentric circle shaped materials 81, 82 and multiple circle shaped magnetic coils 61, 62.

Figure 12:
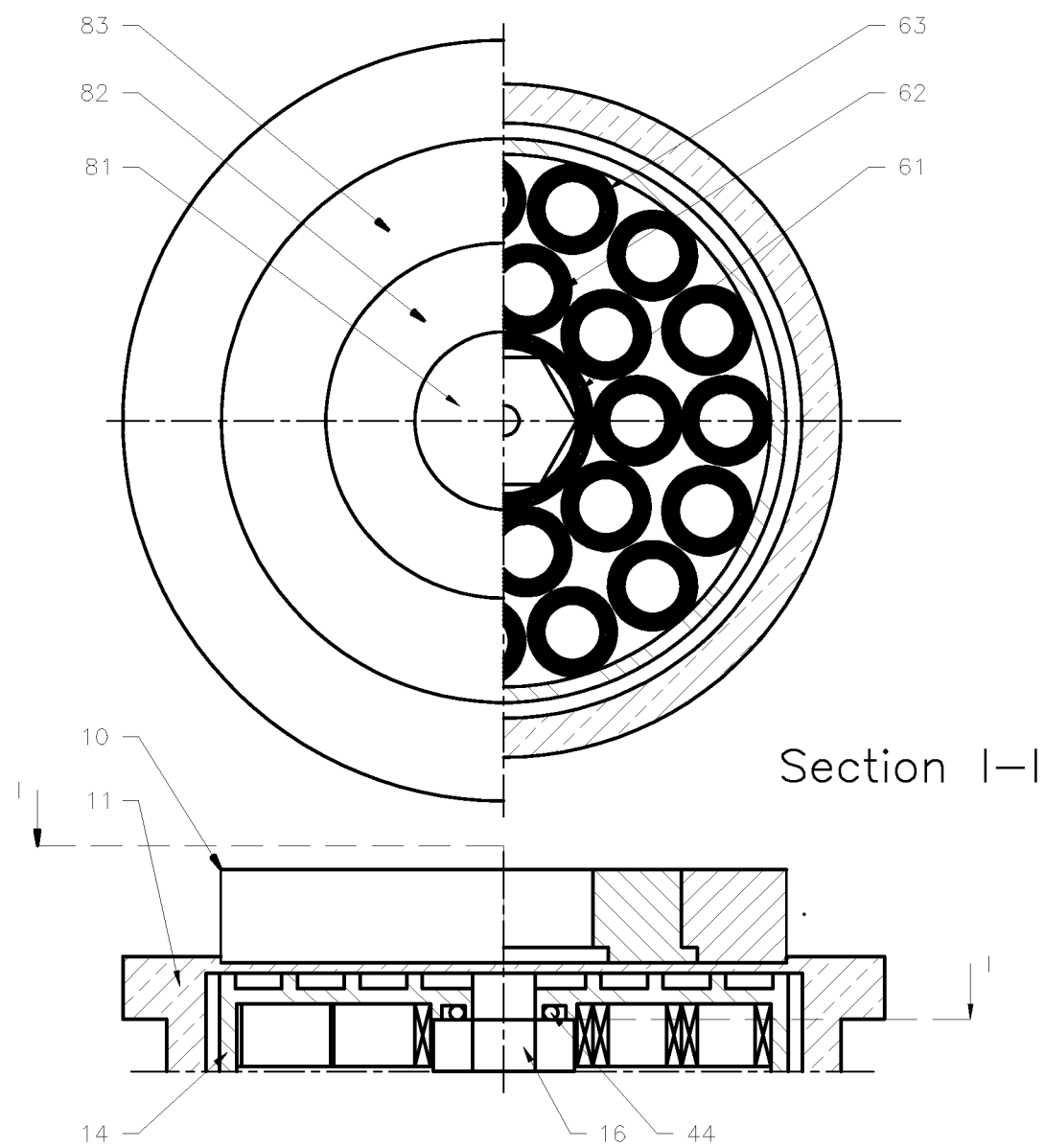
FIG. 12 is a sectional view of the arc source with a round cathode including three sections of concentric circle shaped materials and multiple circle shaped magnetic coil powered by an electronic material sequencer.

FIG. 12 shows further possible potential of the device, the arc source with a round cathode including three sections of concentric circle shaped materials 81, 82, 83 and multiple circle shaped magnetic coils 61, 62, 63. The three concentric circles compose an inner circle 81, a middle ring 82 and an outer ring 83. The concentric circle shaped magnetic coils 61, 62, 63 correspond to the specific section of the cathode containing one of the particular materials 81, 82, 83.

Figure 13:
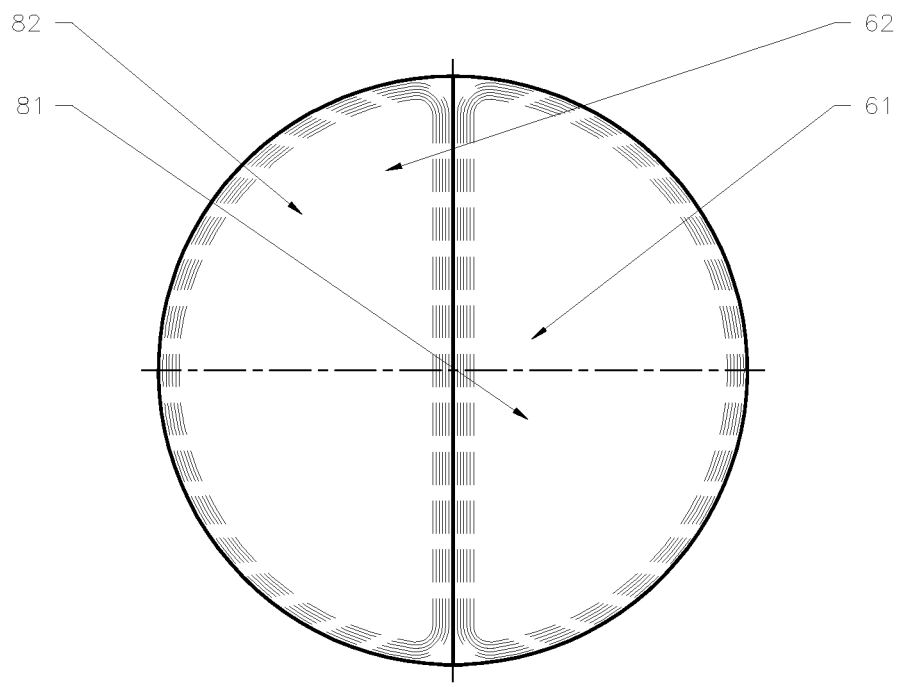
FIG. 13 is a view of a round cathode including two material sections and two half circle shaped magnetic coils powered by an electronic material sequencer.
Figure 14:
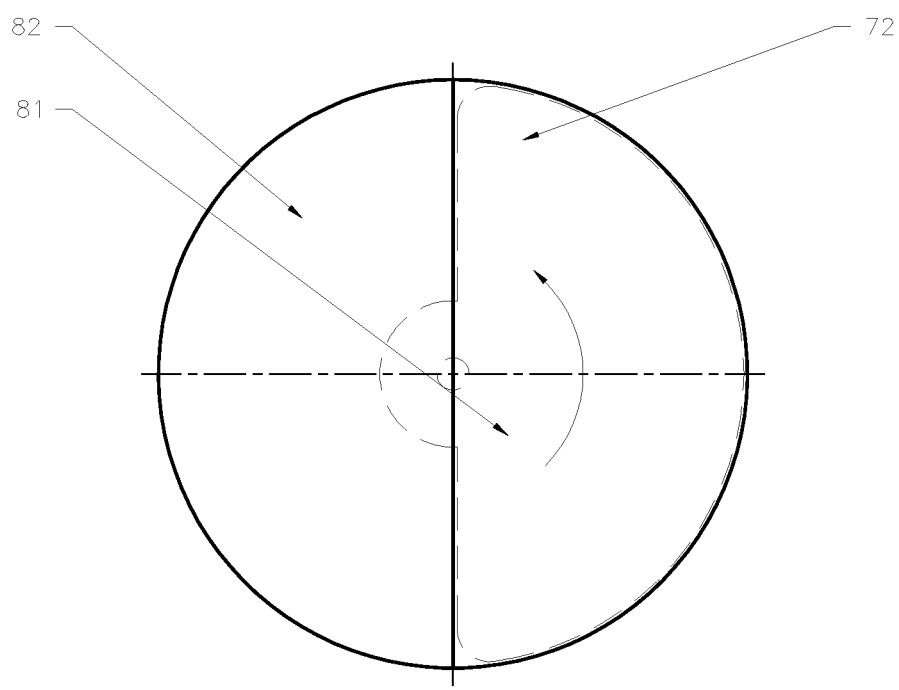
FIG. 14 is a view of a round cathode including two material sections and a half circle shaped magnet motorized by a mechanical material sequencer.

In FIG. 13 a version with a round cathode including two material sections 81, 82 and two half circle shaped magnetic coils 61, 62 is presented.

The same half circle shaped idea is implemented in FIG. 7b. This time around the cathode includes two material sections 81, 82 and is controlled by a half circle shaped magnet 72.

Figure 15:
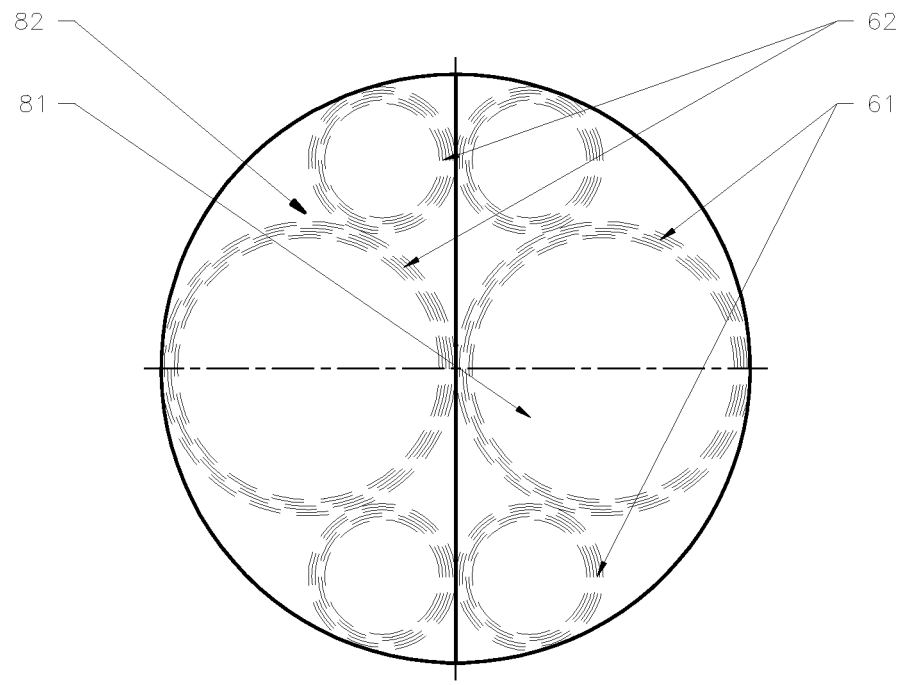
FIG. 15 is a view of a round cathode including two material sections and multiple circle shaped magnetic coils powered by an electronic material sequencer.
Figure 16:
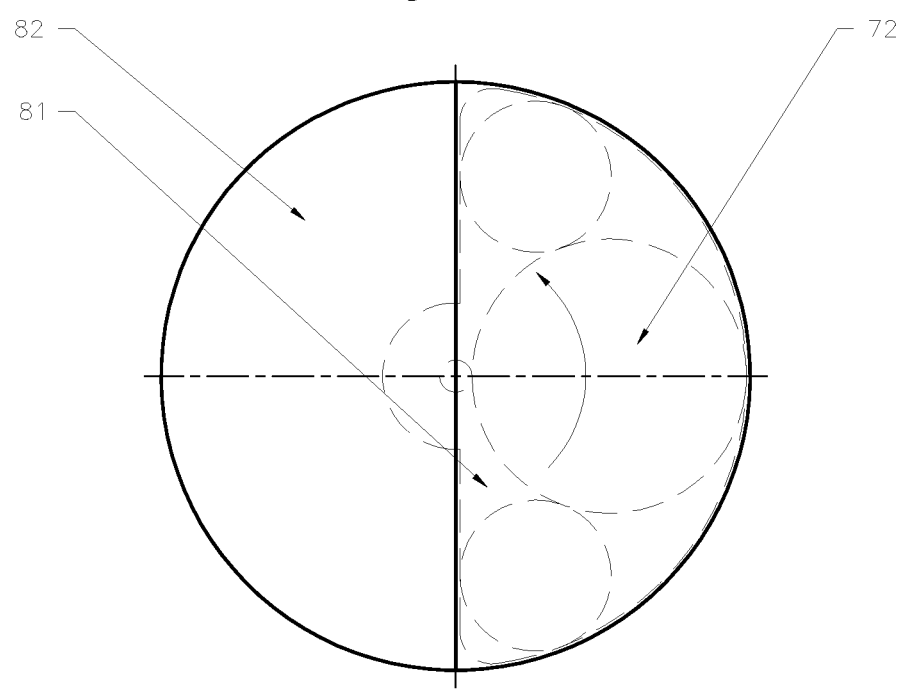
FIG. 16 is a view of a round cathode including two material sections and multiple circle shaped magnets motorized by a mechanical material sequencer.

FIG. 15 and FIG. 16 are simpler solutions of the idea described earlier; a round cathode including two material sections 81, 82 and multiple circle shaped magnetic coils 61, 62 or multiple circle shaped magnets 72. Once again complete and equal utilization of materials 81, 82 is an issue.

Figure 17:
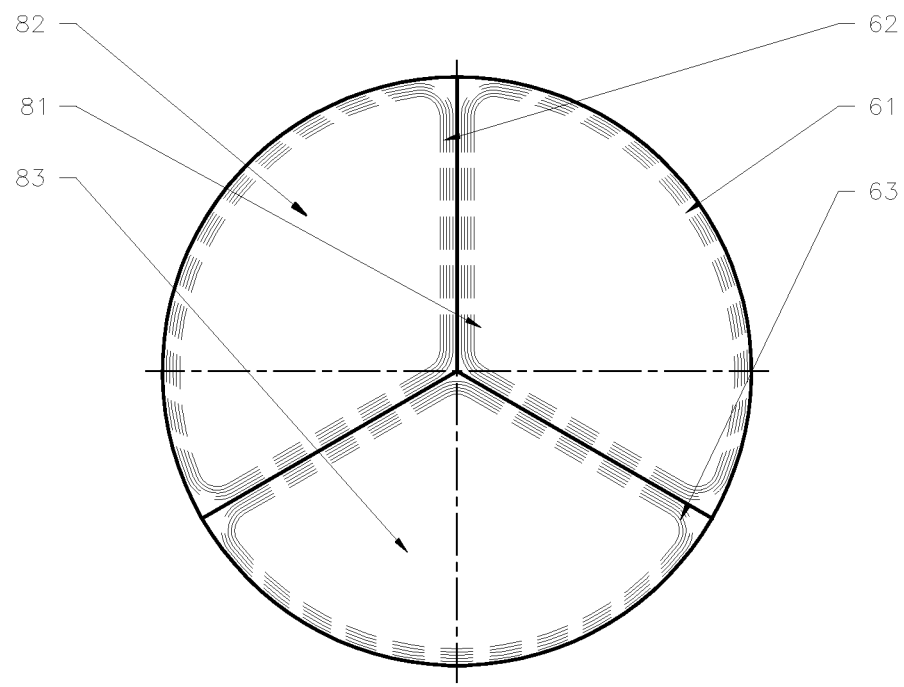
FIG. 17 is a view of a round cathode including three material sections and three one third circle shaped magnetic coils powered by an electronic material sequencer.
Figure 18:
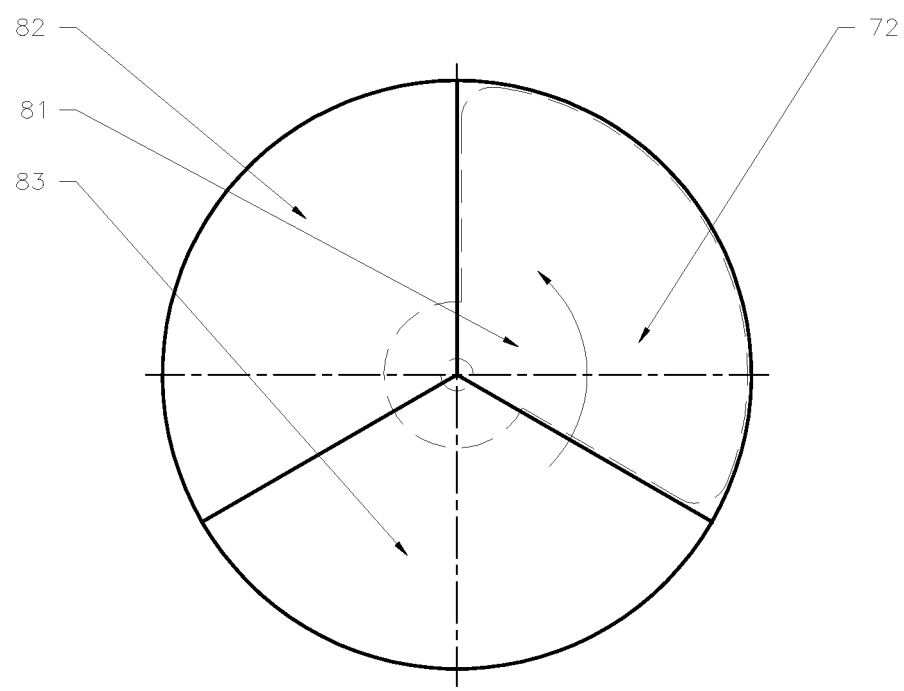
FIG. 18 is a view of a round cathode including three material sections and a third circle shaped magnet motorized by a mechanical material sequencer.
Figure 19:
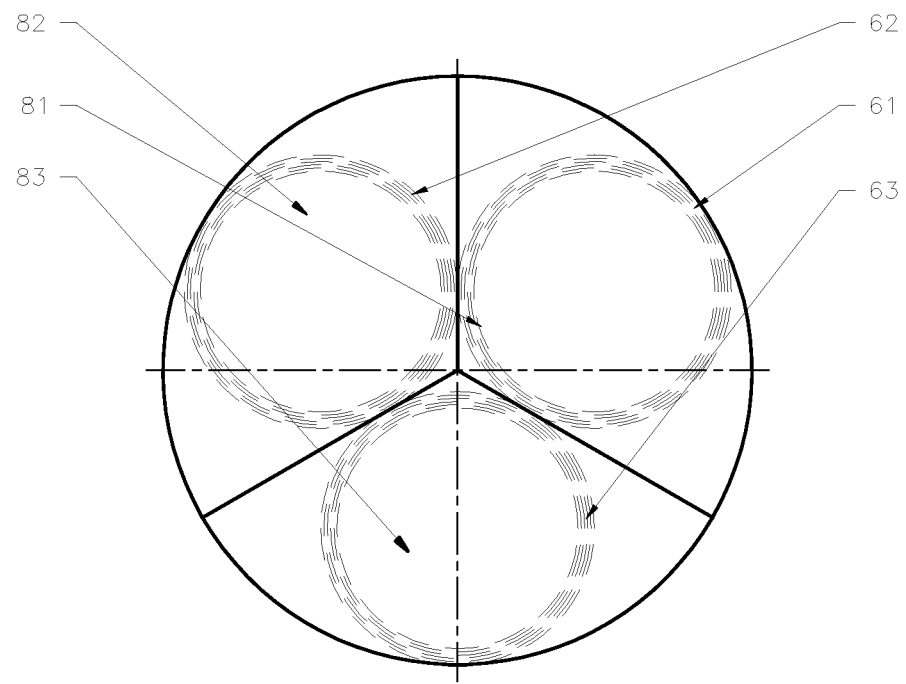
FIG. 19 is a view of a round cathode including three material sections and three circle shaped magnetic coils powered by an electronic material sequencer.
Figure 20:
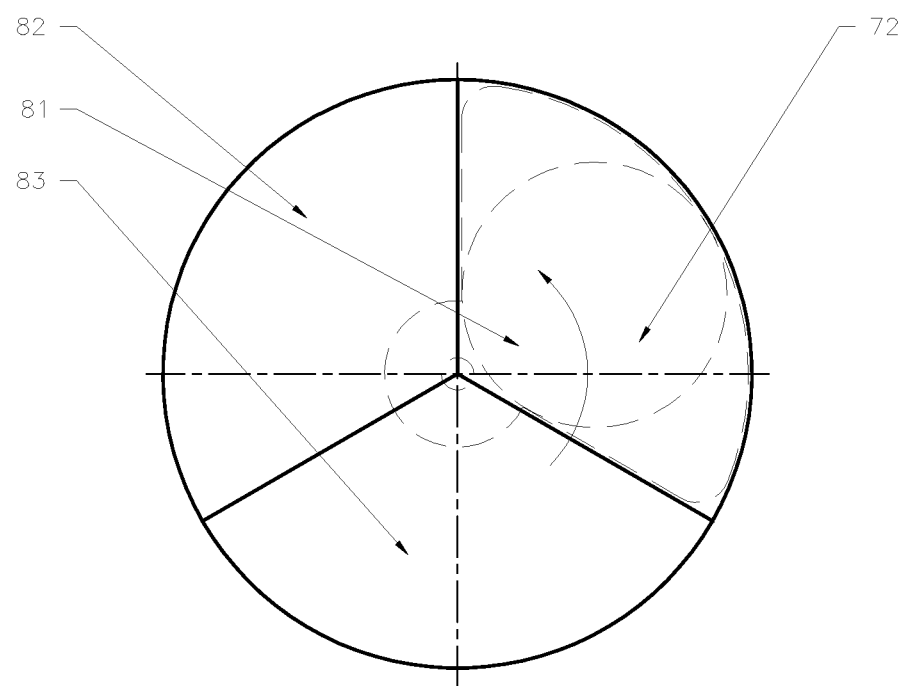
FIG. 20 is a view of a round cathode including three material sections and a circle shaped magnet motorized by a mechanical material sequencer.
Figure 21:
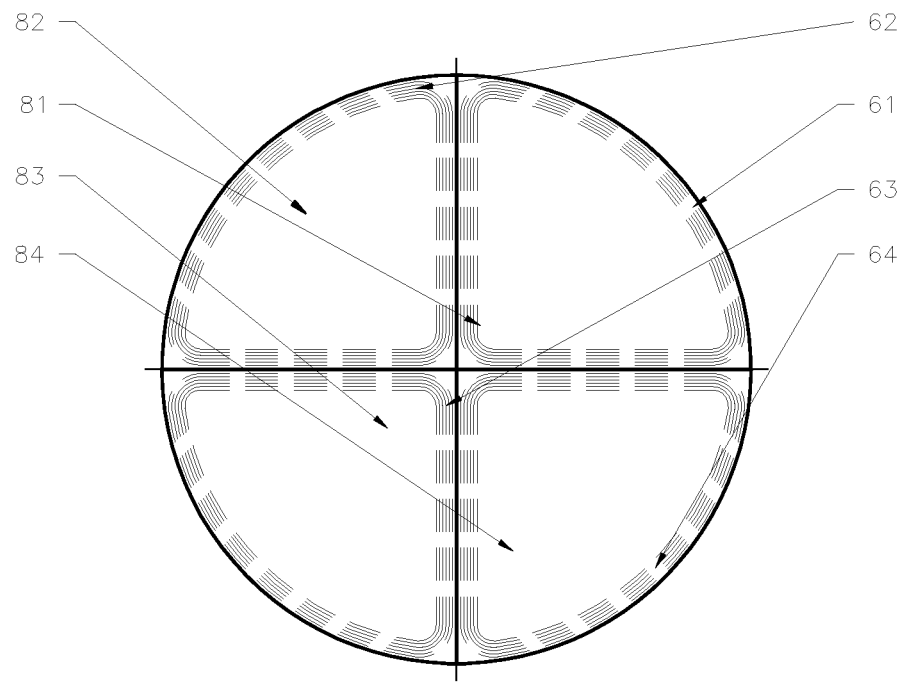
FIG. 21 is a view of a round cathode including four material sections and four quarter circle shaped magnetic coils powered by an electronic material sequencer.
Figure 22:
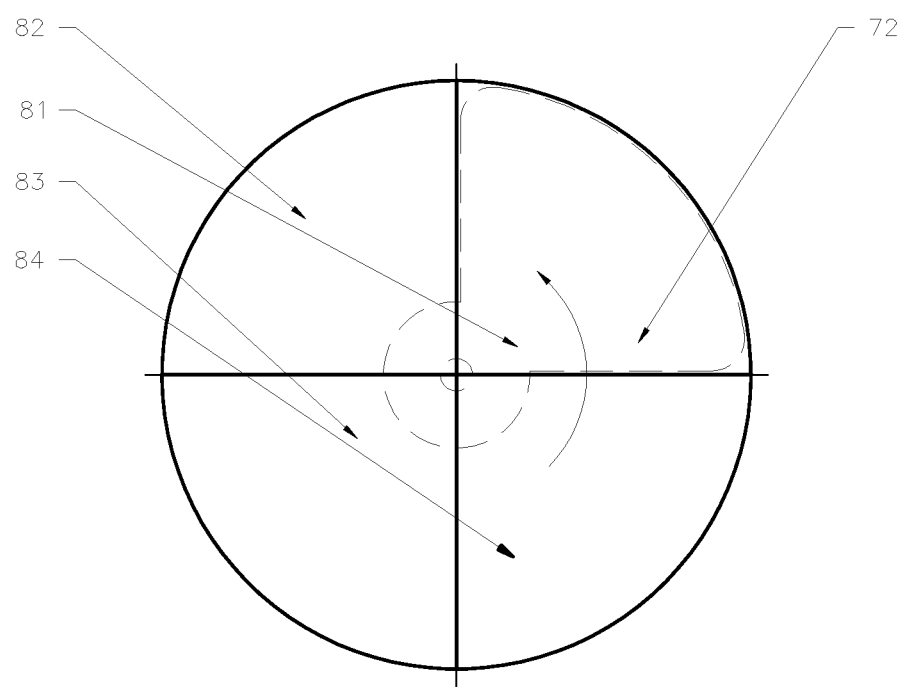
FIG. 22 is a view of a round cathode including four material sections and a quarter circle shaped magnet motorized by a mechanical material sequencer.
Figure 23:
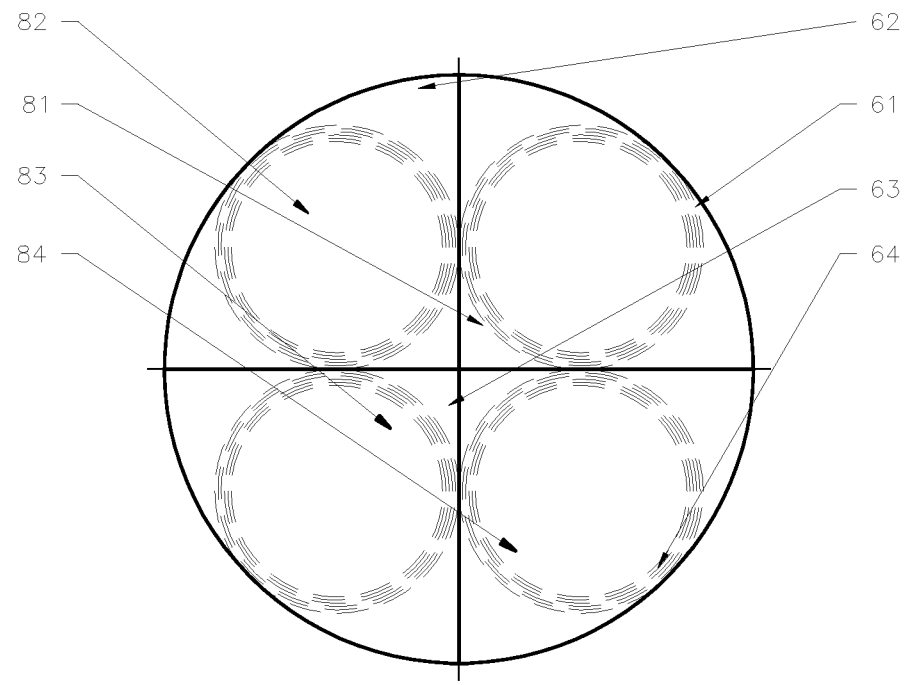
FIG. 23 is a view of a round cathode including four material sections and four circle shaped magnetic coils powered by an electronic material sequencer.
Figure 24:
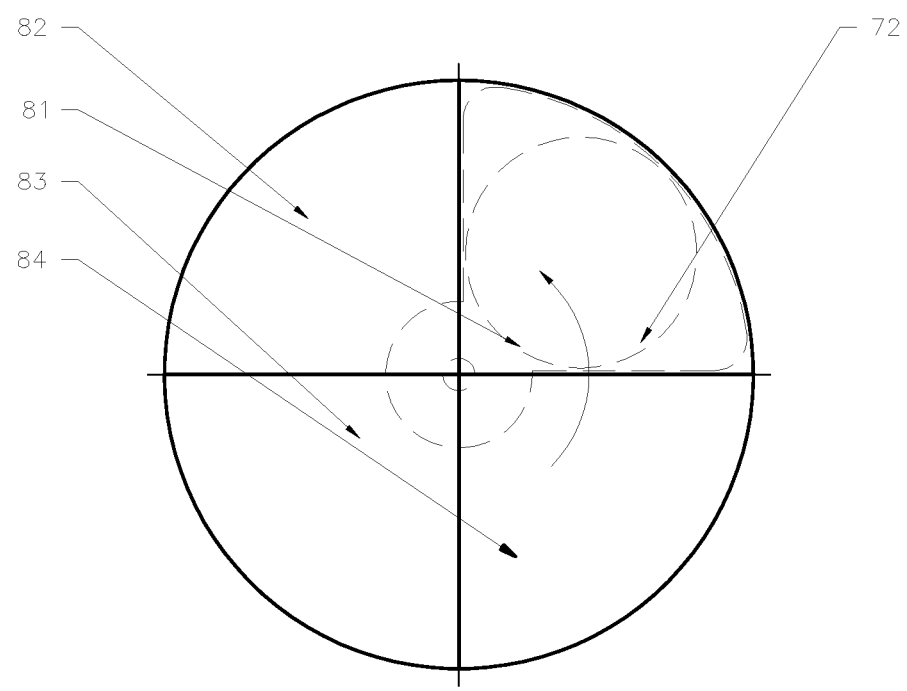
FIG. 24 is a view of a round cathode including four material sections and a circle shaped magnet motorized by a mechanical material sequencer.

Furthermore the following are additional developments of the options presented before: FIG. 17 with a round cathode including three material sections 81, 82, 83 and three third circle shaped magnetic coils 61, 62, 63; FIG. 18 with a round cathode including three material sections 81, 82, 83 and a third circle shaped magnet 72; FIG. 19 with a round cathode including three material sections 81, 82, 83 and three circle shaped magnetic coils 61, 62, 63; FIG. 20 with a round cathode including three material sections 81, 82, 83 and a circle shaped magnet 72; FIG. 11a with a round cathode including four material sections 81, 82, 83, 84 and four quarter circle shaped magnetic coils 61, 62, 63, 64; FIG. 22 with a round cathode including four material sections 81, 82, 83, and a quarter circle shaped magnet 72; FIG. 23 with a round cathode including four material sections 81, 82, 83, 84 and four circle shaped magnetic coils 61, 62, 63, 64; and FIG. 24 with a round cathode including four material sections 81, 82, 83, 84 and a circle shaped magnet 72.

Figure 25:
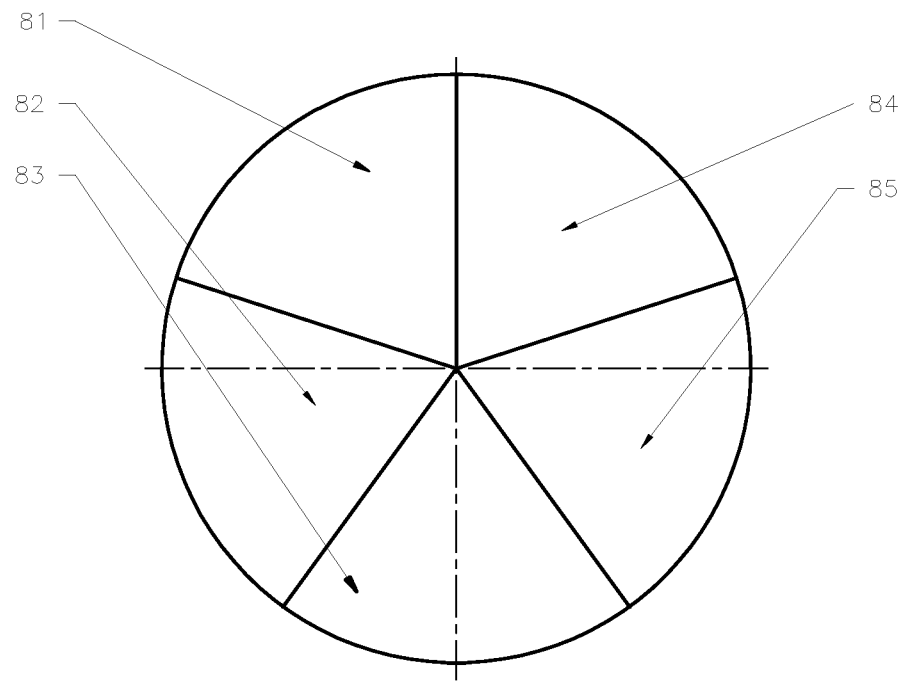
FIG. 25 is a view of a round cathode including five material sections.
Figure 26:
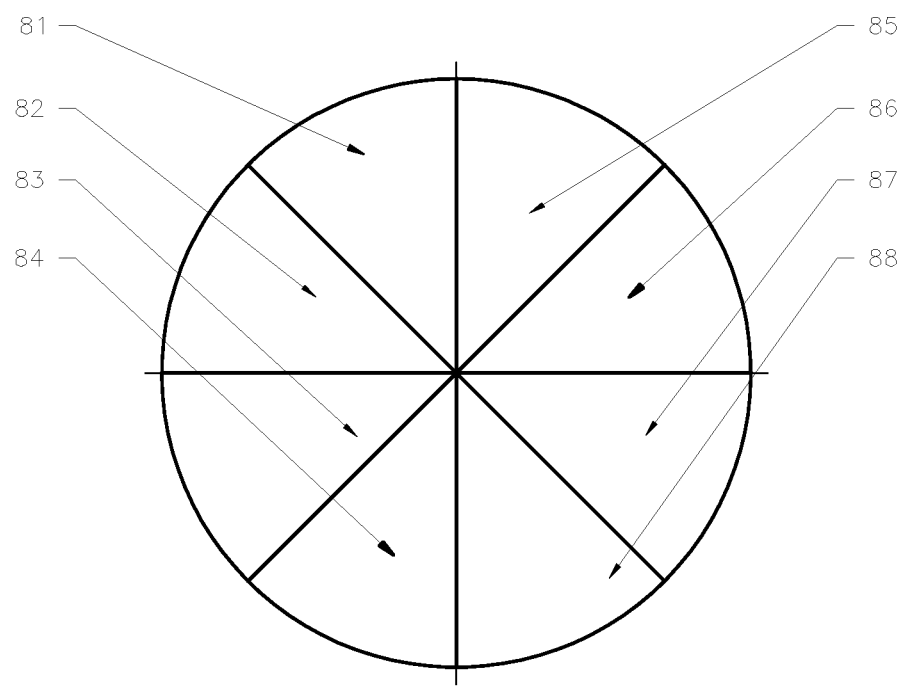
FIG. 26 is a view of a round cathode including eight material sections.

FIG. 25 with a round cathode includes five material sections 81, 82, 83, 84, 85 and FIG. 26 a round cathode includes eight material sections 81, 82, 83, 84, 85, 86, 87, 88 which show possible combinations of dividing the round cathode into the necessary quantity of material segments to reach the requested plurality of materials.

Figure 27:
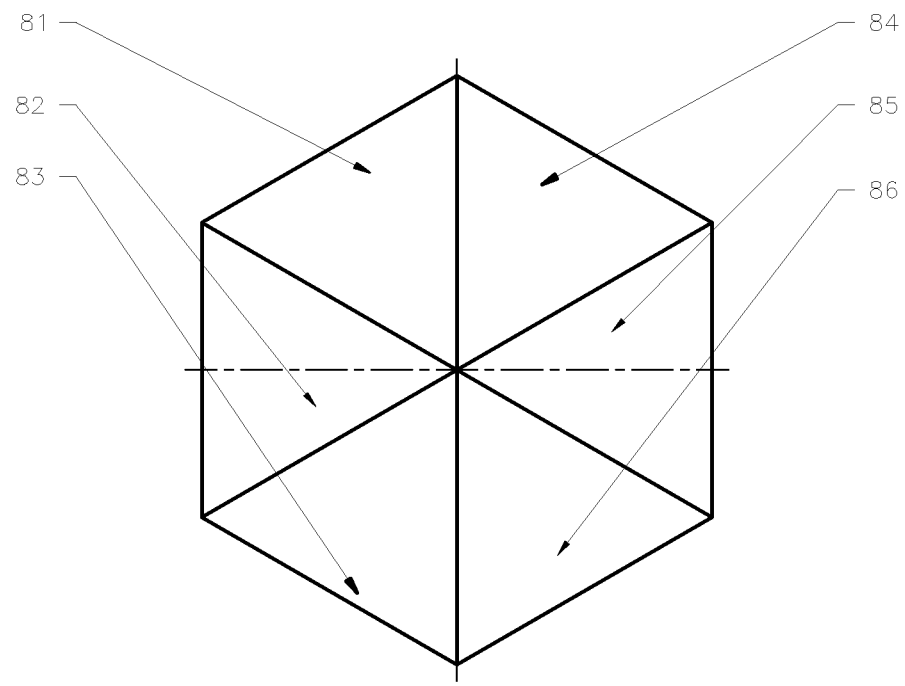
FIG. 27 is a view of a hexagonal cathode including six material sections.
Figure 28:
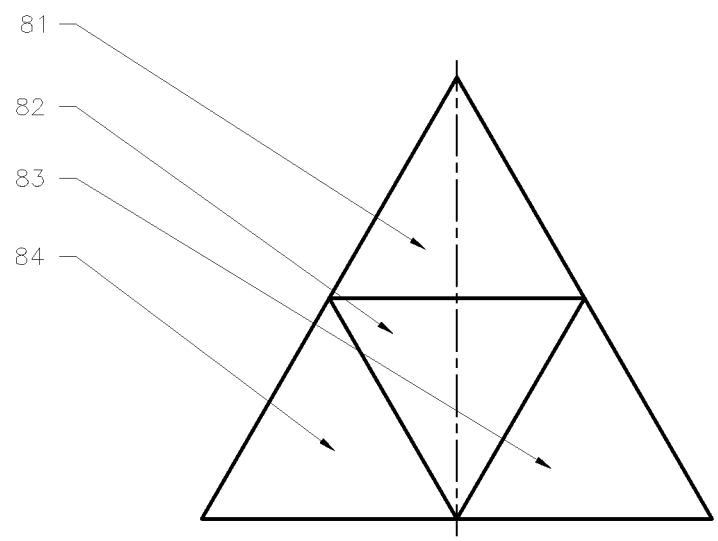
FIG. 28 is a view of a triangle cathode including four material sections.
Figure 29:
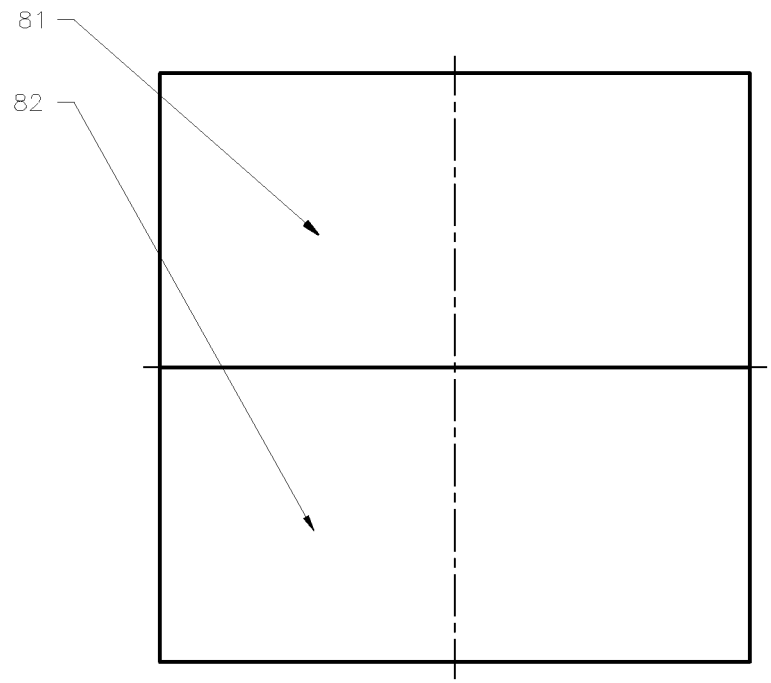
FIG. 29 is a view of a square cathode including two material sections.
Figure 30:
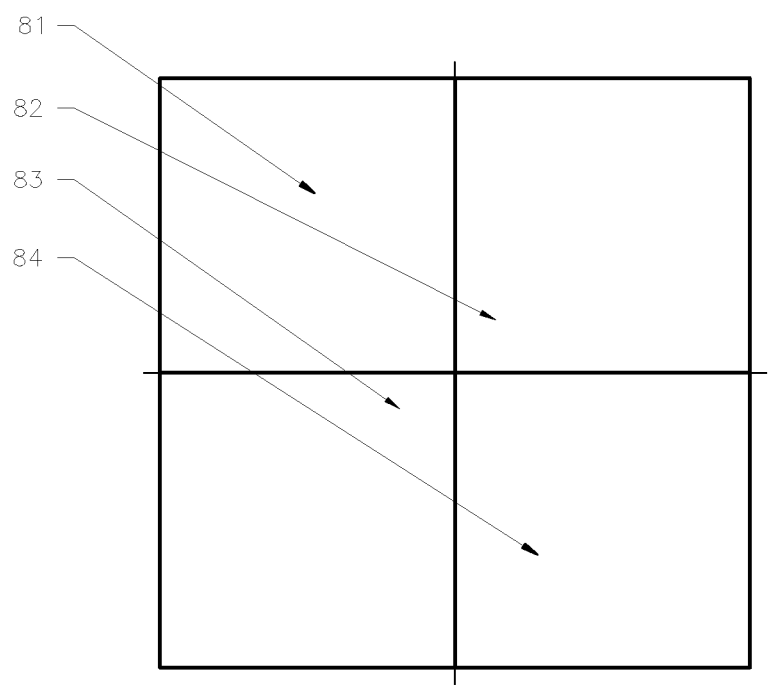
FIG. 30 is a view of a square cathode with four material sections.

Different shapes of the cathode are shown in the following: FIG. 27 with a hexagonal cathode including six material sections 81, 82, 83, 84, 85, 86; FIG. 28 with a triangle cathode including four material sections 81, 82, 83, 84; FIG. 29 with a square cathode including two material sections 81, 82; and FIG. 30 with a square cathode with four material sections 81, 82, 83, 84.

Figure 31:
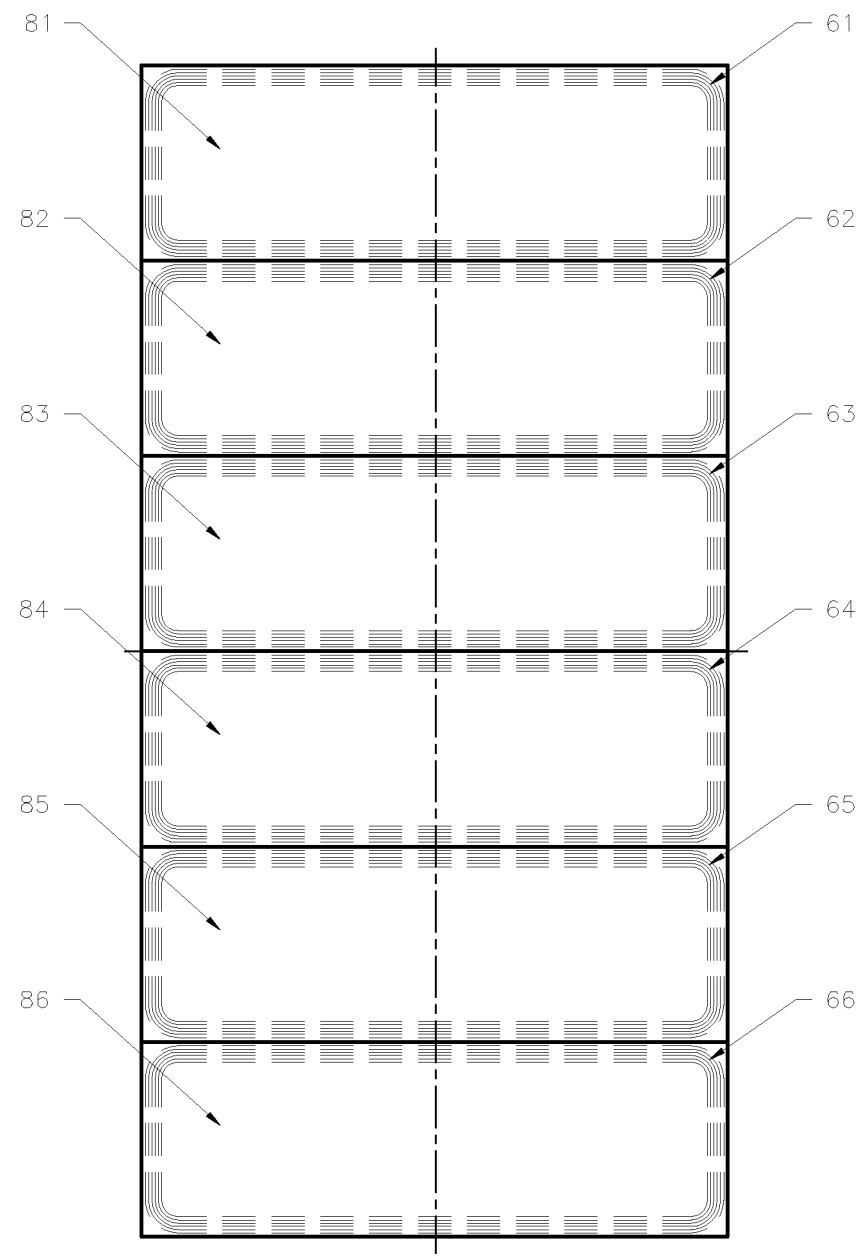
FIG. 31 is a view of a rectangle cathode with six material sections and six rectangle shaped magnetic coils powered by an electronic material sequencer.

FIG. 31 presents a rectangle cathode with six material sections 81, 82, 83, 84, 85, 86 and six rectangle shaped magnetic coils 61, 62, 63, 64, 65, 66. This type of configuration is very useful for large area arc sources.

Figure 32:
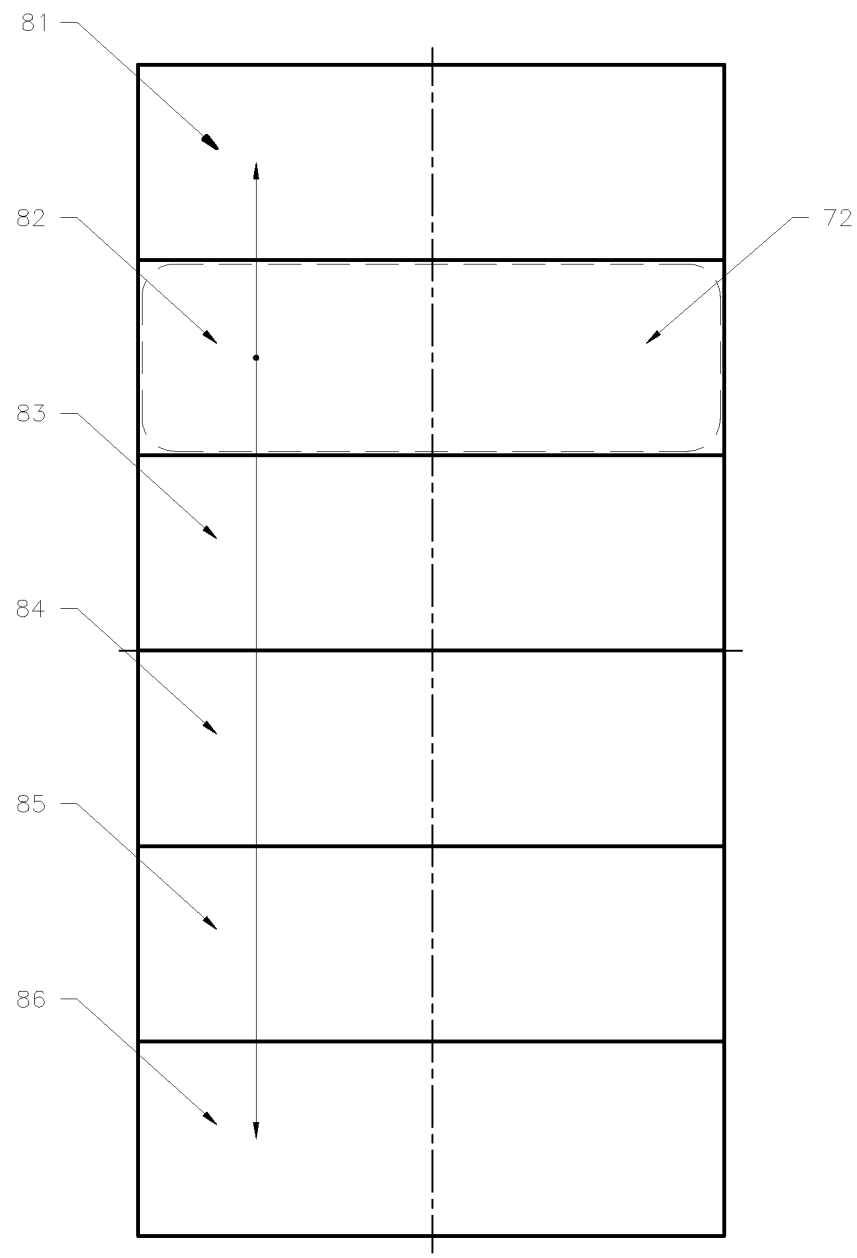
FIG. 32 is a view of a rectangle cathode with six material sections and a rectangle shaped magnet motorized by a mechanical material sequencer.

Continuation of this idea is FIG. 32 witch shows a rectangular cathode with six material sections 81, 82, 83, 84, 85, 86 and a rectangle shaped magnet 72. The magnet 72 is mechanically moved using a step motor or pneumatic or hydraulic device controlled by the mechanical material sequencer.

Figure 33:
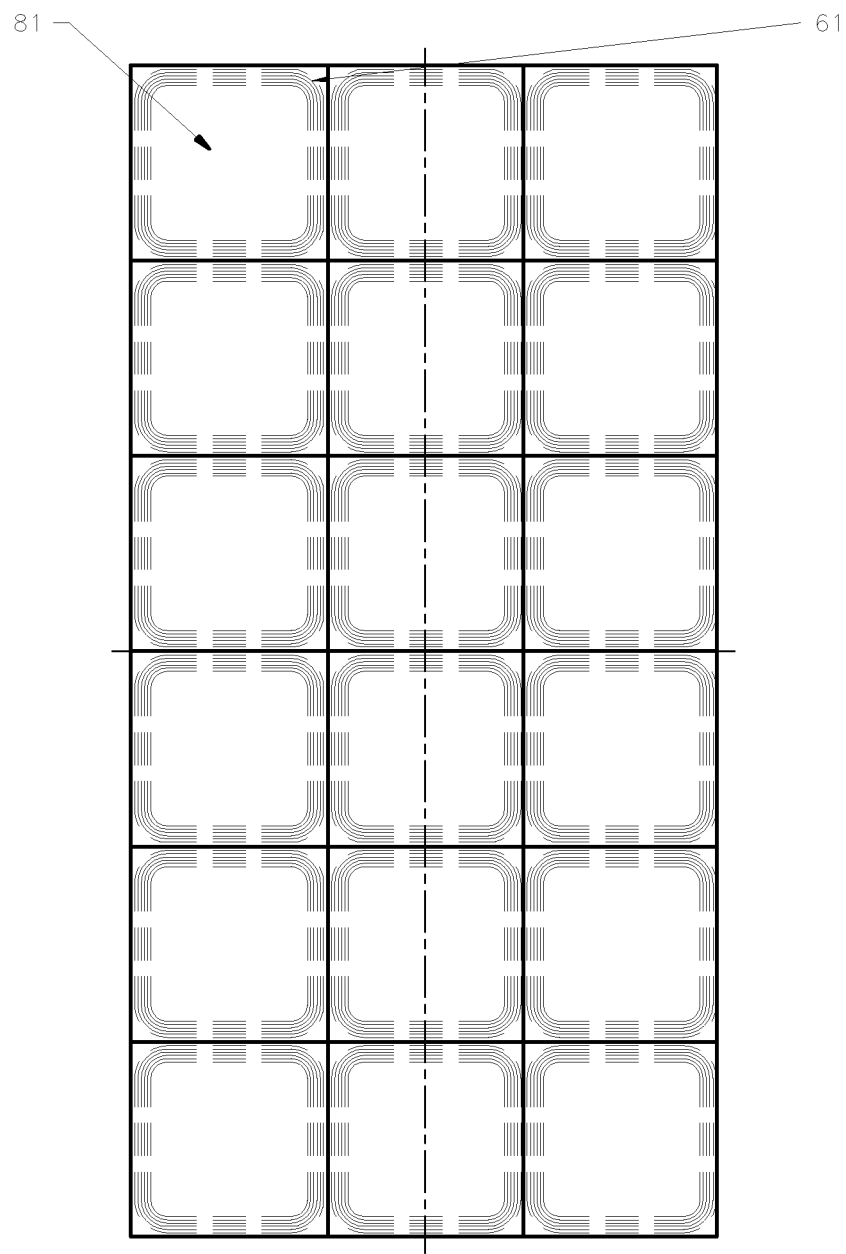
FIG. 33 is a view of a rectangle cathode with eighteen material sections and eighteen square shaped magnetic coils powered by an electronic material sequencer.

Another example of a rectangular cathode is FIG. 33 with eighteen material sections 81 etc. and eighteen square shaped magnetic coils 61 etc.

Figure 34:
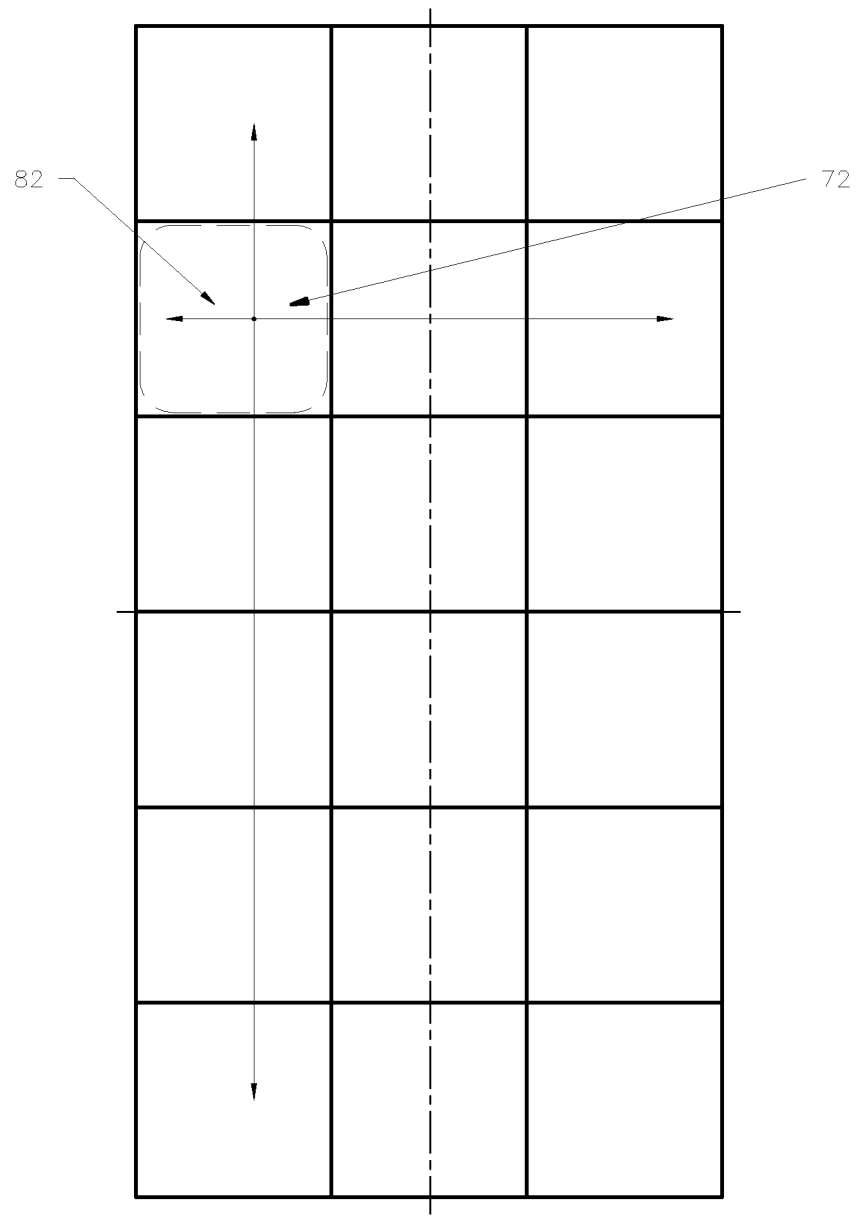
FIG. 34 is a view of a rectangle cathode with eighteen material sections and a square shaped magnet motorized by a mechanical material sequencer.

A motorized square shaped magnet 72 with eighteen material sections 82 etc. is presented in FIG. 34.

Figure 35:
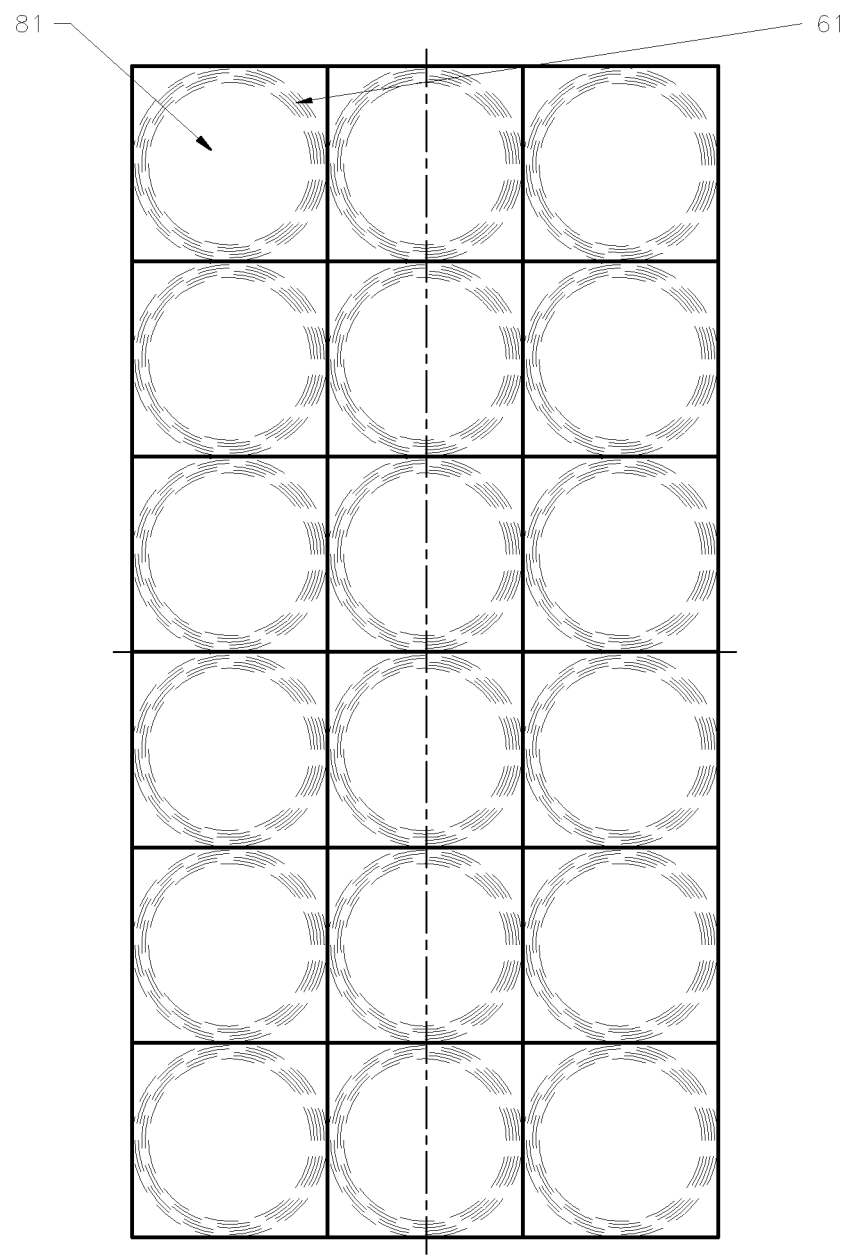
FIG. 35 is a view of a rectangle cathode with eighteen material sections and eighteen circle shaped magnetic coils powered by an electronic material sequencer.

FIG. 35 with a rectangular cathode containing eighteen material sections 81 etc and eighteen circle shaped magnetic coils 61 etc. implements a less efficient version in terms of equal utilization than the version presented in FIG. 33.

Figure 36:
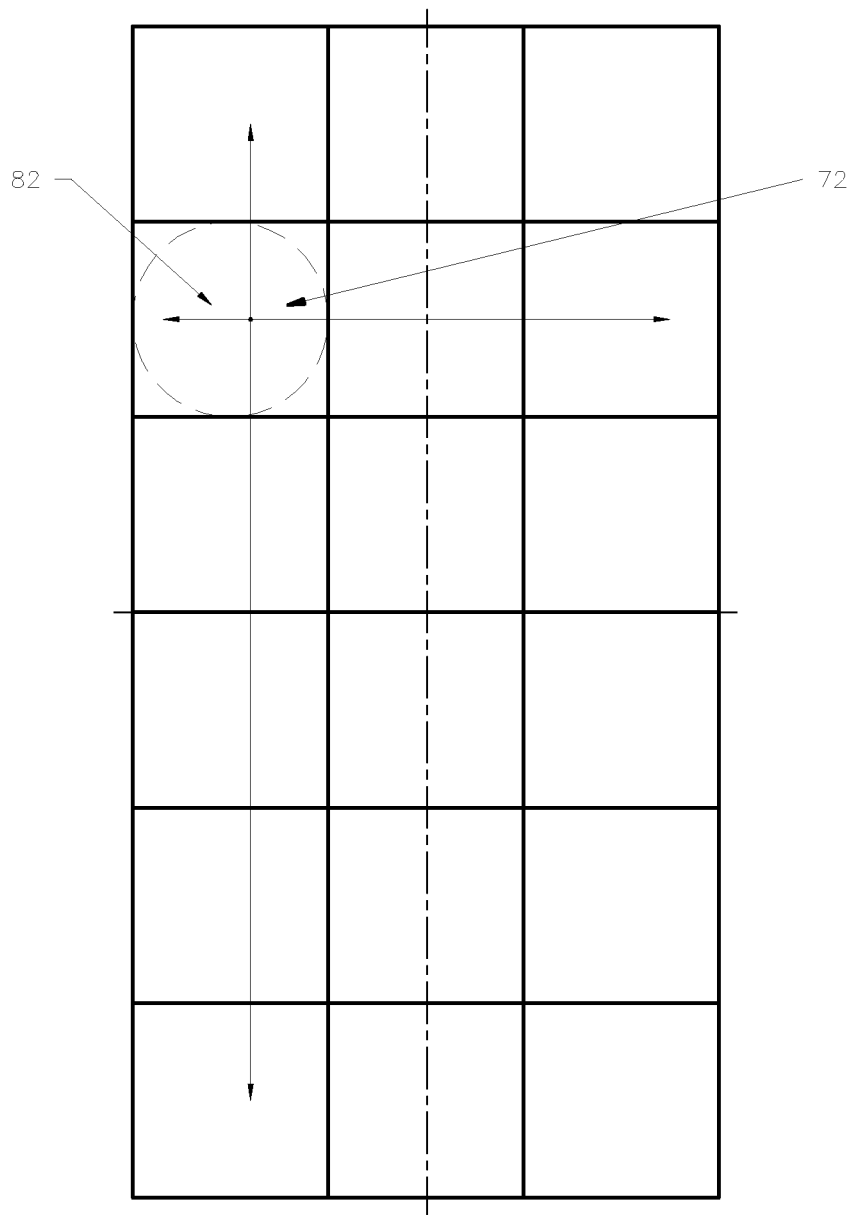
FIG. 36 is a view of a rectangle cathode with eighteen material sections and a circle shaped magnet motorized by a mechanical material sequencer.

In FIG. 36 a rectangular cathode with eighteen sections of materials 82 etc. and a circle shaped magnet 72 is shown.

This type of magnetic field, formed by the mentioned internal constant magnetic field coils or magnets, allows implement many combinations of the magnetic field zone shapes. This permits arbitrary modeling of the cathode shape and material section shape of the particular cathode.

Although the present invention has been described with reference to preferred embodiments, numerous modifications and variations can be made and still the result will come within the scope of the invention. No limitation with respect to the specific embodiments disclosed herein is intended or should be inferred.

What is claimed is:

1. An apparatus which allows for continually changing the structure of an applied film by nanoimplanting atoms, molecules, compounds or other chemical species and structures of different materials on a substrate during arc discharge through a cathodic arc deposition process comprising:
    a cathode with an evaporating surface comprising at least two special sections of diverse materials provided as an active part of an arc source on which the arc discharge is forming during the cathodic arc deposition process;
    a plurality of internal constant magnetic field coils comprising:
        a central magnetic coil having a central axis that is the same as a central axis of the cathode;
        a first closed-loop of inner magnetic coils spaced around the central magnetic coil and substantially surrounding the central magnetic coil;
        a second closed-loop of outer magnetic coils spaced around the first closed-loop of inner magnetic coils and substantially surrounding the first closed-loop of inner magnetic coils;
        each inner magnetic coil of the first closed-loop of magnetic coils has a diameter greater than a diameter of each outer magnetic coil of the second closed-loop of magnetic coils;
        the second closed-loop of outer magnetic coils comprises at least two magnetic coils of different diameters;
        the first closed-loop of inner magnetic coils further comprises the inner magnetic coils overlapping, where each inner magnetic coil is overlapped by two adjacent inner magnetic coils;
        the second closed-loop of outer magnetic coils further comprises the outer magnetic coils overlapping, where each outer magnetic coil is overlapped by two adjacent outer magnetic coils;
    the plurality of internal constant magnetic field coils placed directly behind the cathode to create magnetic lines of force normal to a surface of the cathode;
    an anode for completing an arc.

2. The apparatus as specified in claim 1 wherein said cathode has the evaporating surface in a shape of a circle divided into two or more circle part shaped sections.

3. The apparatus as specified in claim 1 wherein said cathode has the evaporating surface in a shape of a circle divided into concentric circles forming a circle and one or more ring shaped sections.

4. The apparatus as specified in claim 1 wherein said cathode has the evaporating surface shaped as a hexagon, triangle, square or rectangle.

5. The apparatus as specified in claim 1 wherein said cathode has the evaporating surface divided into circle, triangle, square or rectangle shaped sections.

* * * * *